US006359468B1

(12) United States Patent
Park et al.

(10) Patent No.: US 6,359,468 B1
(45) Date of Patent: Mar. 19, 2002

(54) PROGRAMMABLE LOGIC DEVICE WITH CARRY LOOK-AHEAD

(75) Inventors: James Park, San Jose; Wei-Jen Huang, Burlingame; Tony Ngai, Campbell; Bruce B. Pedersen, San Jose, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/516,865

(22) Filed: Mar. 2, 2000

Related U.S. Application Data

(60) Provisional application No. 60/122,788, filed on Mar. 4, 1999, provisional application No. 60/142,511, filed on Jul. 6, 1999, and provisional application No. 60/142,513, filed on Jul. 6, 1999.

(51) Int. Cl.[7] ............................................. H03K 19/177
(52) U.S. Cl. .............................. 326/39; 328/38; 328/41
(58) Field of Search ...................... 326/37–41

(56) References Cited

U.S. PATENT DOCUMENTS

| 4,623,982 A | 11/1986 | Ware ........................... 364/788 |
| 4,742,520 A | 5/1988 | Hoac et al. .................... 371/49 |
| 4,815,022 A | 3/1989 | Glaeser et al. ............... 364/716 |
| 4,963,770 A | 10/1990 | Keida ........................... 307/465 |
| 5,053,647 A | 10/1991 | Shizukuishi et al. ........ 307/465 |
| 5,059,828 A | 10/1991 | Tanagawa ................... 307/469 |
| 5,274,581 A | 12/1993 | Cliff et al. ................... 364/784 |
| 5,349,250 A | 9/1994 | New ........................... 307/465 |
| 5,362,999 A | 11/1994 | Chiang ........................ 326/44 |
| 5,386,156 A | 1/1995 | Britton et al. ................ 326/37 |
| 5,396,127 A | 3/1995 | Chan et al. ................... 326/44 |
| 5,448,186 A | 9/1995 | Kawata ........................ 326/41 |
| 5,481,206 A * | 1/1996 | New et al. ..................... 326/38 |
| 5,537,057 A | 7/1996 | Leong et al. ................. 326/41 |
| 5,570,039 A | 10/1996 | Oswald et al. ................ 326/39 |
| 5,631,576 A | 5/1997 | Lee et al. ...................... 326/39 |
| 5,672,985 A | 9/1997 | Lee .............................. 326/41 |
| 5,675,262 A | 10/1997 | Duong et al. ................. 326/41 |
| 5,689,195 A | 11/1997 | Cliff et al. .................... 326/41 |
| RE35,977 E | 12/1998 | Cliff et al. ............. 364/716.06 |
| 5,859,542 A | 1/1999 | Pedersen ...................... 326/39 |
| 5,909,126 A | 6/1999 | Cliff et al. .................... 326/41 |
| 5,926,036 A | 7/1999 | Cliff et al. .................... 326/40 |
| 5,999,015 A * | 12/1999 | Cliff et al. .................... 326/39 |

FOREIGN PATENT DOCUMENTS

| WO | WO98/45947 | 10/1998 |
| WO | WO98/51013 | 11/1998 |

OTHER PUBLICATIONS

Actel Corporation, "Implementing Multipliers with Actel FPGAs", Application Note, pp. 4–73 through 4–80, Apr. 1996.

(List continued on next page.)

Primary Examiner—Michael Tokar
Assistant Examiner—Don Phu Le
(74) Attorney, Agent, or Firm—Fish & Neave; Jeffrey H. Ingerman

(57) ABSTRACT

A programmable logic device is adapted to predict carry values in long-chain-carry logic configurations. In the most preferred embodiment, which functions in any long-carry-chain logic configuration, each logic region calculates a result for both values of the carry-in signal to that region, and when a carry signal for the group to which the region belongs reaches the region, the correct result in each region, and thence the correct carry-out for that group, are calculated and propagated. The carry-out terminal of one group is arranged to be adjacent to the carry-in terminal of the next group, to enhance carry propagation speed. In another embodiment, each region looks back two regions to predict the carry-in. In two additional embodiments, logic is provided to mathematically calculate the carry values.

19 Claims, 16 Drawing Sheets

OTHER PUBLICATIONS

Freeman, R.H., "XC3000 family of user-programmable gate arrays," *Microprocessors and Microsystems*, vol. 13, No. 5, Jun. 1989, pp. 313–320.

Hill, D.D., et al., "Preliminary Description of Tabula Rasa, an Electrically Reconfigurable Hardware Engine," *Proceedings of the 1990 IEEE International Conference on Computer Designs: VLSI in Computers & Processors*, Sep. 17–19, 1990, pp. 391–395.

Lucent Technologies Inc., "Multipliers in ORCA OR2CxxA/OR2TxxA FPGAs", Microelectronics Application Note, pp. 1–8, May 1996.

Lucent Technologies Inc., "Implementing and Optimizing Multipliers in ORCA FPGAs", Microelectronics Group Application Note, pp. 1–12, Feb. 1997.

Patterson, D.A., et al., *Computer Architecture, A Quantitative Approach*, second ed., pp. A–38 to A–46 (Morgan Kaufmann Publishers, San Francisco, 1990).

* cited by examiner

PROGRAMMABLE LOGIC DEVICE WITH CARRY LOOK-AHEAD

CROSS REFERENCE TO RELATED APPLICATIONS

This claims the benefit of copending, commonly-assigned U.S. Provisional Patent Applications Nos. 60/122,788, 60/142,511 and 60/142,513, filed Mar. 4, 1999, Jul. 6, 1999 and Jul. 6, 1999, respectively, which are hereby incorporated by reference herein in their entireties.

BACKGROUND OF THE INVENTION

This invention relates to programmable logic devices in which long-carry-chain logic can be implemented. More particularly, this invention relates to programmable logic devices including circuitry for "predicting" a carry result to speed up the remainder of a logic operation.

Programmable logic devices ("PLDs") typically include (1) many regions of programmable logic, and (2) programmable interconnection resources for selectively conveying signals to, from, and/or between those logic regions. Each logic region is programmable to perform any of several different, relatively simple logic functions. The interconnection resources are programmable to allow the logic regions to work together to perform much more complex logic functions than can be performed by any individual logic region. Examples of known PLDs are shown in U.S. Pat. No. 3,473,160, U.S. Pat. No. Re. 34,363, U.S. Pat. Nos. 5,689,195 and 5,909,126, and U.S. patent application Ser. No. 09/266,235, all of which are hereby incorporated by reference herein in their entireties.

It is known to provide, in addition to the standard interconnection network, a "carry" output from one logic region connected directly to a carry input of a neighboring logic region. This allows the second logic region to more quickly perform a logic function that depends on the carry output of the first logic region, because the direct carry connection allows the carry output to propagate more quickly to the second logic region than if it were routed on the general interconnection network.

The carry feature has several different uses. One use may be in arithmetic functions, such as addition where different logic regions are handling different bits of a multiple-bit addition problem. In such a case, except for the logic region handling the least significant bits, each logic region needs to know the value of the carry output from the logic region handling the bits of immediately lower significance. In some cases, many logic regions may be involved in a "long-carry-chain" calculation.

In a carry chain configuration, although the data for all logic regions may arrive substantially simultaneously, none of the regions can complete its operations until the carry arrives from the immediately preceding region. In a short carry chain, the delay involved in having each region wait for the preceding region is minimal. However, in a long carry chain, the cumulative delay at regions toward the end of the chain (e.g., the most significant bits in the arithmetic addition example) could be substantial.

It would be desirable to be able to provide a programmable logic device in which the values of carry signals could be predicted or determined in advance of completion of the operation forming the carry signal.

SUMMARY OF THE INVENTION

It is an object of this invention to provide a programmable logic device in which the values of carry signals can be predicted or determined in advance of completion of the operation forming the carry signal.

In accordance with the present invention, there is provided a programmable logic device having a plurality of regions of programmable logic. Each region has a plurality of input terminals and at least one output terminal, and each region is programmable to selectively perform any of a plurality of logic functions on input signals applied to the input terminals to produce an output signal applied to the output terminal. An interconnection network is programmable to selectively connect the output terminal of substantially any of the regions to at least one of the input terminals of substantially any of the regions. The programmable logic device is programmable to configure a plurality of the regions to perform a logic function requiring provision of at least one carry signal from one of the regions to another of the regions. The regions are arranged in groups, and the device further includes additional logic dedicated to propagating the carry signal to other regions without regard to completion of logic operations in the region. The additional logic includes circuitry for propagating the carry signal from one of the groups of regions to another of the groups of regions. That circuitry includes a carry-out in one of the groups for outputting a carry signal from that one of the groups and a carry-in in another of the groups for inputting a carry signal to that other group. The carry-in and the carry-out are arranged adjacent one another.

In accordance with another aspect of the invention, there is provided a programmable logic device having a plurality of regions of programmable logic, each having a plurality of input terminals and at least one output terminal, and each being programmable to selectively perform any of a plurality of logic functions on input signals applied to the input terminals to produce an output signal applied to the output terminal. An interconnection network is programmable to selectively connect the output terminal of substantially any of the regions to at least one of the input terminals of substantially any of the regions. The programmable logic device is programmable to configure a plurality of the regions to perform a logic function requiring provision of at least one carry signal from one of the regions to another of the regions. The device further comprises additional logic dedicated to propagating the carry signal to others of the regions without regard to completion of logic operations in the one region. The additional logic includes circuitry in the one region for calculating, separately from the logic function, the value for the carry signal to be input to the other regions as a function of a signal propagated into the first region.

In accordance with yet another embodiment of the invention, there is provided a programmable logic device comprising a plurality of regions of programmable logic, each having a plurality of input terminals and at least one output terminal, and each being programmable to selectively perform any of a plurality of logic functions on input signals applied to the input terminals to produce an output signal applied to the output terminal. An interconnection network is programmable to selectively connect the output terminal of substantially any of the regions to at least one of the input terminals of substantially any of the regions. The programmable logic device is programmable to configure a plurality of the regions into a chain of at least three regions to perform a logic function requiring provision of a carry signal from each of the regions to a subsequent region in the chain. The additional logic comprises circuitry in each of the regions for (i) receiving a carry signal from a region immediately preceding an immediately preceding region in the chain, (ii)

receiving at least one propagation signal from the immediately preceding region in the chain, (iii) receiving at least one propagation signal from within the region, and (iv) producing a carry signal as a function of (1) the carry signal from the region immediately preceding the immediately preceding region in the chain, (2) the at least one propagation signal from the immediately preceding region, and (3) the at least one propagation signal from within the region.

In a preferred embodiment, the invention is implemented in a programmable logic device of the type described in copending, commonly-assigned U.S. patent application Ser. No. 09/516,921, filed concurrently herewith, which is hereby incorporated by reference herein in its entirety, and in above-incorporated U.S. Pat. No. 5,689,195 and applications Ser. Nos. 60/122,788 and 60/142,513. In such a programmable logic device, logic is arranged in regions, which are then arranged in groups or blocks spanning, preferably, ten rows of logic regions. The interconnection network includes local conductors, global conductors, and conductors of intermediate lengths.

In the preferred embodiment, each logic region preferably has four data inputs and the additional logic in each logic region is an arrangement of multiplexers that allow the logic region to calculate its logic function based on the two alternative carry-in possibilities, and then ultimately to select the correct result as the carry signal becomes available. The arrangement of multiplexers preferably also calculates both possible carry-out signals for the logic region, which in a chained configuration are provided as the two possible carry-in values to the next logic region in the logic chain.

In the arrangement just described, it is still necessary to wait for the carry values to propagate through the carry chain. However, the propagation of the carry values is still much faster than waiting for the carry values to be generated by the actual logic functions. Moreover, the wait can be further shortened by breaking the carry chain, which includes a plurality of regions, into smaller groups of regions, allowing the carry signals to propagate substantially simultaneously within all groups so that each group has two possible carry-out signals, and then propagating a carry-in signal into each group to allow selection of the correct carry-out signal, both within each region in the group, and at the group carry-out. The carry-in for each group will be the carry-out from the previous group, except in the case of the first group.

This arrangement means that the maximum wait for propagation of carry signals through the carry chain will be the time necessary for the alternative carry signals to propagate through the longest group. By the time that happens, each region, and each group, will have generated its respective pair of two alternative carry values. At that point, the initial carry-in to the first group will cause selection of the correct carry values for the regions in the first group and the first group itself. That group carry can be propagated relatively quickly to the next group, which has already finished its alternative carry signal generation process and is ready to select its final carry values, and so on to other groups through the end of the carry chain. This propagation from group to group, with no further computation involved, is very fast.

The speed at which the carry values are propagated can further be improved by the physical layout of the regions in a carry chain. For example, in the programmable logic device described in said above-incorporated U.S. Pat. No. 5,689,195, the logic regions are grouped in groups spanning ten rows of logic regions. It is frequently necessary to propagate a carry from one of those groups to an adjacent group, and indeed to do so through several groups. One might think to arrange the regions within each group linearly, so that the carry propagates into the group at the top of the column and is propagated out at the bottom of the column. In such an arrangement, it is necessary to wait for the carry generation process to propagate through an entire group before the correct carry can be propagated to the next group. In addition, there is a small but measurable further delay as the carry signal propagates back up to the top of the next column, which has completed its own carry generation process but is waiting for the carry from the previous group.

Therefore, in accordance with the invention, the logic regions are laid out so that if a carry chain is to be created by the programming of the programmable logic device, the carry chain may be broken into two halves, with the first half starting at the top of a column and ending in the middle, and the second half starting at the bottom of that column and ending in the middle. This has two advantages.

First, the groups of regions in a carry chain are broken into smaller groups, so that the time that must elapse for the carry generation process to propagate through each group is reduced. Second, the carry outputs of each group are arranged physically closer to one another, so that the time needed for propagation from one group to the next, so that each group can select its final carry value, is also reduced. In another embodiment, the groups are not broken into smaller groups, but the carry signals are propagated horizontally from each group to a multiplexer or similar element at the end of the next group which has received the internal carry generation results of its own group and uses the carry signal to make a final selection. The carry signal is also propagated backwards through the second group to the individual regions in the second group so that they can complete their individual logic functions. This at least eliminates the short propagation delay that would result from propagating the carry signal from the bottom of one group to the top of the next group.

In a second preferred embodiment, rather than propagating across groups, the carry is propagated forward by two regions—i.e., a carry propagated from one region skips the immediately adjacent region and propagates to the next following region. That next following region is able to predict the correct carry value of the skipped region from the propagated value of the previous region and other inputs, as described below. In this embodiment, there are effectively two carry chains, as each skipped region in the first chain propagates its carry to the region following the region immediately adjacent it. In this second carry chain, the skipped regions are the regions of the first chain, and vice-versa. This arrangement achieves about a 50% time savings in the carry chain as compared to not implementing any form of carry look-ahead.

In third and fourth embodiments, the carry is predicted by implementing in the logic a mathematical prediction as described below. Preferably, this is done once for each group, and the carries are propagated horizontally in a manner similar to the alternative version of the first embodiment, as described above. In these third and fourth embodiments, the carry chain can be broken down into smaller groups of regions to speed up the carry prediction, as described above in connection with the first embodiment.

The first embodiment has the advantage that it can predict the carry values for any type of chained logic function. The second, third and fourth embodiments, on the other hand, function only when the chained logic is part of an arithmetic operation, such as an adder chain.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
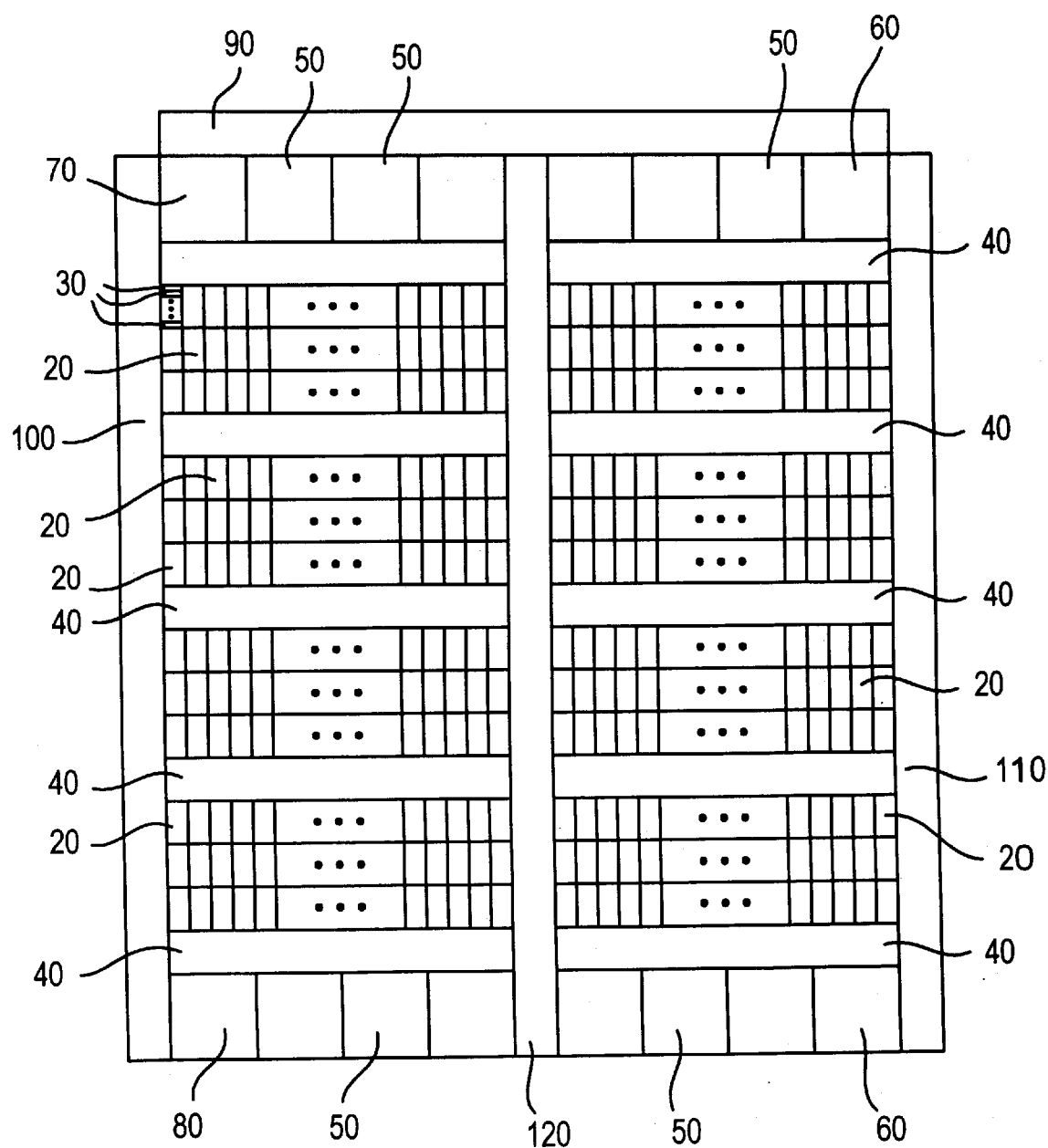
FIG. 1 is a simplified block diagram of an illustrative programmable logic device in which the present invention can be used.

Although the present invention can be used in different types of programmable logic devices, an illustrative programmable logic device 10 in which the present invention can be used is shown in FIG. 1, and is also described in above-incorporated applications Ser. Nos. 60/122,788, 60/142,513, and 09/516,921. Device 10 preferably includes twelve rows of blocks 20 of programmable logic. Each row preferably includes forty blocks 20. Thus blocks 20 preferably are disposed on device 10 in a two-dimensional array of twelve rows intersecting forty columns of blocks 20.

Each block 20 preferably includes ten regions 30 of programmable logic. To avoid over-complicating FIG. 1, the individual regions 30 are delineated only in the extreme upper-left-hand block 20. As will explained more fully below, each region 30 is programmable by a user of device 10 to perform preferably any of several relatively small logic functions. Extremely complex logic functions preferably can be performed by concatenating regions 30 via a programmable network of interconnection conductors and other associated interconnection resources on device 10.

Preferably, interspersed among the rows of blocks 20 are five rows of input/output ("I/O") pins and associated I/O circuitry 40. One of I/O rows 40 preferably is at the top of the rows of block 20. Another I/O row 40 preferably is at the bottom of the rows of block 20. A third I/O row 40 preferably is between the third and fourth rows of block 20. A fourth I/O row 40 preferably is between the sixth and seventh rows of block 20. A fifth I/O row 40 preferably is between the ninth and tenth rows of block 20.

Above the top I/O row 40 preferably is a row of memory blocks 50 that can be used by the user of device 10 as random access memory ("RAM"), read-only memory ("ROM"), product-term ("p-term") logic, content addressable memory, etc. Another similar row of memory blocks 50 preferably is provided below bottom I/O row 40.

At the right-hand end of each row of memory blocks 50 preferably is a block 60 of phase-locked loop circuitry which can be used to generate clock signals that are shifted in phase relative to clock signals that are applied to device 10 from external circuitry that is not shown in FIG. 1.

At the left-hand end of the top row of blocks 50 preferably is a block 70 of control logic and pins. This circuitry preferably is used for controlling device 10 during programming and test of the device prior to its use in normal logic operations.

At the left-hand end of the bottom row of blocks 50 preferably is a block 80 of JTAG logic and pins. The circuitry of block 80 can be used by the user of the device for in-system programming and test of device 10 prior to use of the device in normal logic operations.

The top-most row of circuitry shown in FIG. 1 preferably is address and clear register circuitry 90 that is used during programming of device 10 prior to normal logic operations. The left-most column of circuitry shown in FIG. 1 preferably is data register circuitry 100 that is used during programming prior to normal logic operations. The right-most column of circuitry shown in FIG. 1 preferably is test register circuitry 110 that is also used during programming prior to normal logic operations. In typical use, programming data preferably are loaded into circuitry 100 from external circuitry that is not shown. These data preferably flow from left to right across device 10 for storage in a vertical slice of locations preferably determined by address information in circuitry 90. Data for use in confirming that device 10 is properly programmable and/or properly operable can be read out of device 10 via registers 110.

Block 120 of so-called secondary signal conductor resources preferably is located at or near the left-to-right center of device 10. Block 120 preferably is part of a network of signal propagation resources that is used for distributing widely needed signals throughout device 10. Examples of such signals include clock signals, clear signals, set signals, reset signals, and the like.

Figure 2:
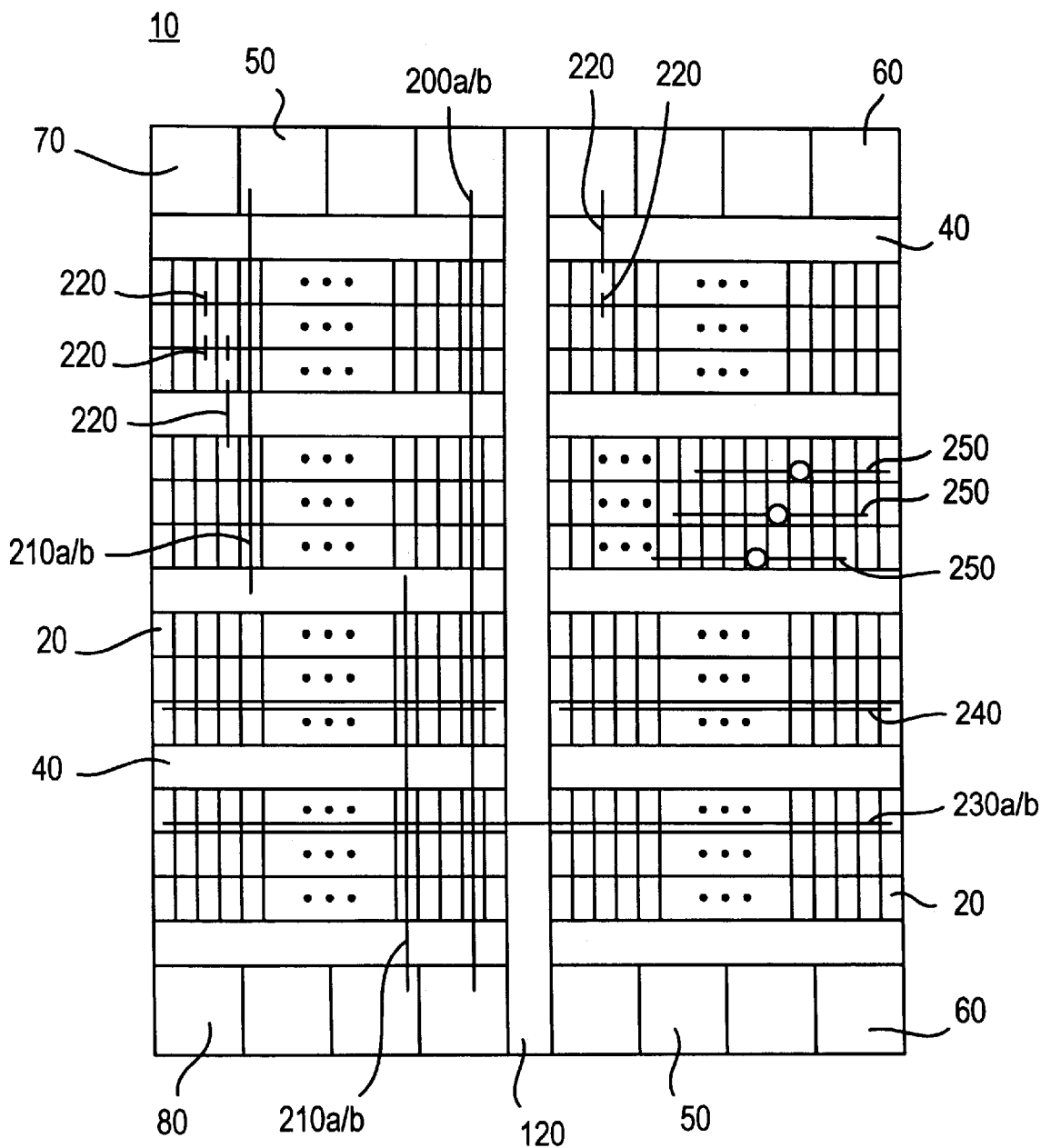
FIG. 2 shows a portion of the programmable logic device of FIG. 1 with the addition of representative, illustrative interconnection resources.

FIG. 2 is similar to a portion of FIG. 1, but shows some of the interconnection resources that are provided on device 10. Preferably, associated with each column of logic blocks 20, and extending into memory rows 50, is a plurality of so-called global vertical conductors 200. Only some representative conductors 200 are shown in FIG. 1 to avoid overcrowding the drawing. Each group of conductors 200 preferably includes a relatively large subset of such conductors designated 200a that have normal signal propagation speed characteristics. Each group of conductors 200 preferably also includes a relatively small subset of such conductors designated 200b that have significantly faster signal propagation speed characteristics.

Preferably, associated with the upper half of each column of logic blocks 20, and extending into the upper row of memory blocks 50, is a plurality of so-called half vertical interconnection conductors 210. Similar half vertical interconnection conductors 210 preferably are associated with the lower half of each column of logic blocks 20 and the lower row of memory blocks 50. Again, only some representative conductors 210 are shown to avoid overcrowding the drawing. As in the case of conductors 200, each set of conductors 210 preferably includes a relatively large subset 210a of normal-speed conductors and a relatively small subset 210b of higher-speed conductors. The ratio of conductors 210a to conductors 210b may be similar to the ratio of conductors 200a to 200b.

Preferably, also associated with each column of logic blocks 20 are pluralities of so-called interleaved vertical ("IV") conductors 220. Once again, only some representative conductors 220 are shown to avoid overcrowding the drawing. Each group of conductors 220 preferably extends between vertically adjacent logic blocks 20 and memory blocks 50, preferably extending across any intervening I/O block 40. Whereas conductors 200 and 210 are useful for conveying signals between any of the rows of elements 20, 40, and 50 that they cross, conductors 220 are useful for speeding up connections between vertically adjacent elements 20 and 50, and for additionally helping to reduce the numbers of conductors 200 and 210 that must be provided to satisfy the need for vertical interconnectivity on device 10. Additional details regarding IV conductors can be found in copending, commonly-assigned U.S. patent application Ser. No. 09/517,146, which is hereby incorporated by reference herein in its entirety.

Preferably, associated with each row of logic blocks 20 is a plurality of so-called global horizontal interconnection conductors 230. Only some representative conductors 230 are shown to avoid overcrowding the drawing. Each set of conductors 230 preferably includes a relatively large subset 230a of normal-speed conductors and a relatively small subset 230b of significantly faster conductors. The ratio of normal to fast conductors 230 may be similar to previously described ratios of normal to fast conductors.

Preferably, associated with and extending along the left half of each row of logic blocks 20 is a plurality of so-called half or direct horizontal interconnection conductors 240. Similar half horizontal conductors 240 preferably extend along the right half of each row of logic block 20. Once again, only a few representative conductors 240 are shown to avoid overcrowding the drawing.

Also preferably associated with each row of logic blocks 20 are several pluralities of so-called HNFL (horizontal network of fast lines) interconnection conductors 250. Except at the ends of the rows, where some HNFL conductors are necessarily shorter, each group of HNFL conductors 250 preferably spans ten logic block 20. In addition, the conductors in each group of HNFL conductors 250 preferably are drivable only by the logic block 20, or other signal sources, at the center of that group (exceptions again being made at the ends of the rows). Whereas conductors 230 and 240 are useful for conveying signals between any of the logic blocks 20 that they span, conductors 250 preferably are usable only to convey signals from the logic block 20, or other signal sources, that are central to the group that includes that conductor to the fixed number of logic blocks to the left and/or right of that central logic block. Each logic block 20 in each row preferably is the central/driving logic block for an associated plurality of conductors 250. Additional details regarding HNFL conductors can be found in above-incorporated copending, commonly-assigned U.S. patent application Ser. No. 09/517,146.

Figure 3:
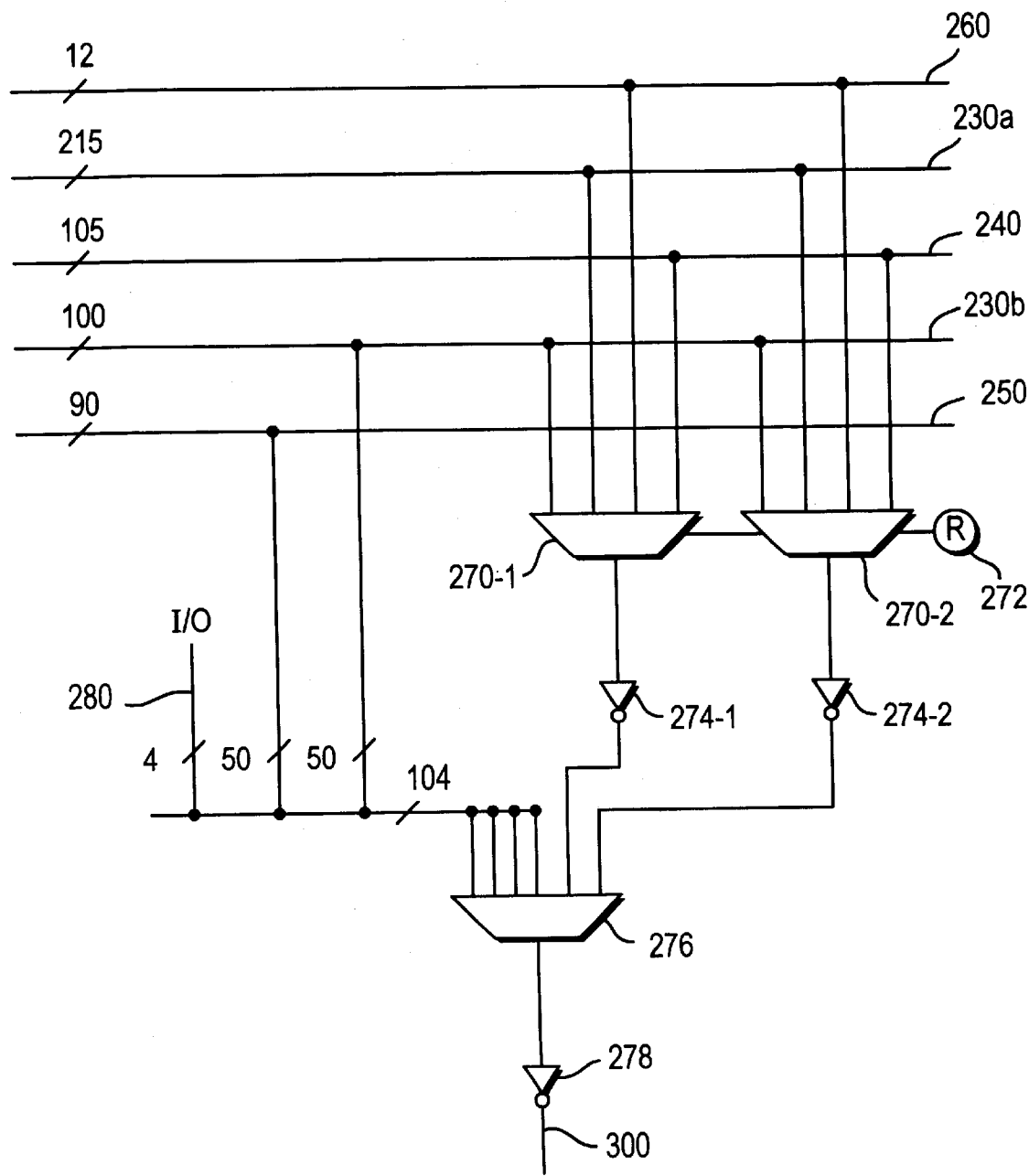
FIG. 3 is a simplified schematic block diagram of additional representative, illustrative interconnection resources for use on the device of FIGS. 1 and 2 in accordance with the invention.

FIG. 3 shows representative interconnectivity and circuitry for conveying signals from horizontal conductors associated with a row of logic blocks 20 to logic blocks in that row. FIG. 3 shows that there are 215 normal-speed global horizontal conductors 230a passing near a logic block, 100 fast global horizontal conductors 230b passing near that logic block, 105 half horizontal conductors 240 passing near the logic block, 90 HNFL conductors 250 passing near the logic block, and twelve secondary conductors 260 passing near the logic block. As noted earlier, the last-mentioned secondary conductors 260 may convey signals such as clocks, clears, and the like. Some of these signals 260 may come from central secondary signal block 120 (FIG. 1); others may be generated more locally (e.g., in the adjacent row of logic blocks 20) and may be usable only in the locale of the source (i.e., the source row).

FIG. 3 further shows a representative logic-block-feeding conductor 300. Depicted conductor 300 is one of a group of 26 similar conductors that are disposed between two horizontally adjacent logic blocks 20 in the logic block row served by the depicted conductors 230a, 230b, etc. Similar groups of 26 conductors 300 are interleaved between all horizontally adjacent logic blocks 20 in all logic block rows.

For each conductor 300, selected ones of conductors 230a, 230b, 240, and 260 are connected to inputs of two programmable logic connectors ("PLCs"; e.g., multiplexers) 270-1 and 270-2. PLCs 270 are each typically controlled by programmable function control elements ("FCEs") 272 to apply to their output the signal on any one of their inputs. (Although shown with four inputs, it will be understood that each PLC 270 may have fewer or more than four inputs (e.g., two, three, six, seven, or eight inputs).) The output signal of each PLC 270 is applied to a respective inverting buffer (amplifier) 274, and thence to a respective input of PLC 276. The other inputs to PLC 276 come from selected ones of adjacent conductors 230b and 250 and (via leads 280) from an associated I/O block 40 (if any). PLC 276 is controlled by FCEs (not shown, but similar to FCEs 272) to apply to its output the signal on any one of its inputs. The output signal of PLC 276 is applied to conductor 300 via inverting buffer 278. The above-mentioned association of I/O blocks 40 and logic blocks 20 is as follows: top rows 20 and 40, second row 40 and fourth row 20, third row 40 and seventh row 20, fourth row 40 and tenth row 20, and fifth row 40 and twelfth row 20.

The interconnectivity shown in FIG. 3 is preferably such that each of the depicted conductors 230, 240, 250, 260, and 280 adjacent to a logic block 20 has a way to get to at least one conductor 300 to the left or right of that logic block. In addition, each conductor 230b and 250 has a way to get to at least one conductor 300 to the left or right of the logic block directly via a PLC 276 and without having to pass through a PLC 270. This last point is significant because conductors 230b and 250 are optimized for speed, and it is faster for a signal to get to a conductor 300 via only elements 276 and 278, rather than having to also pass through elements 270 and 274.

Figure 4:
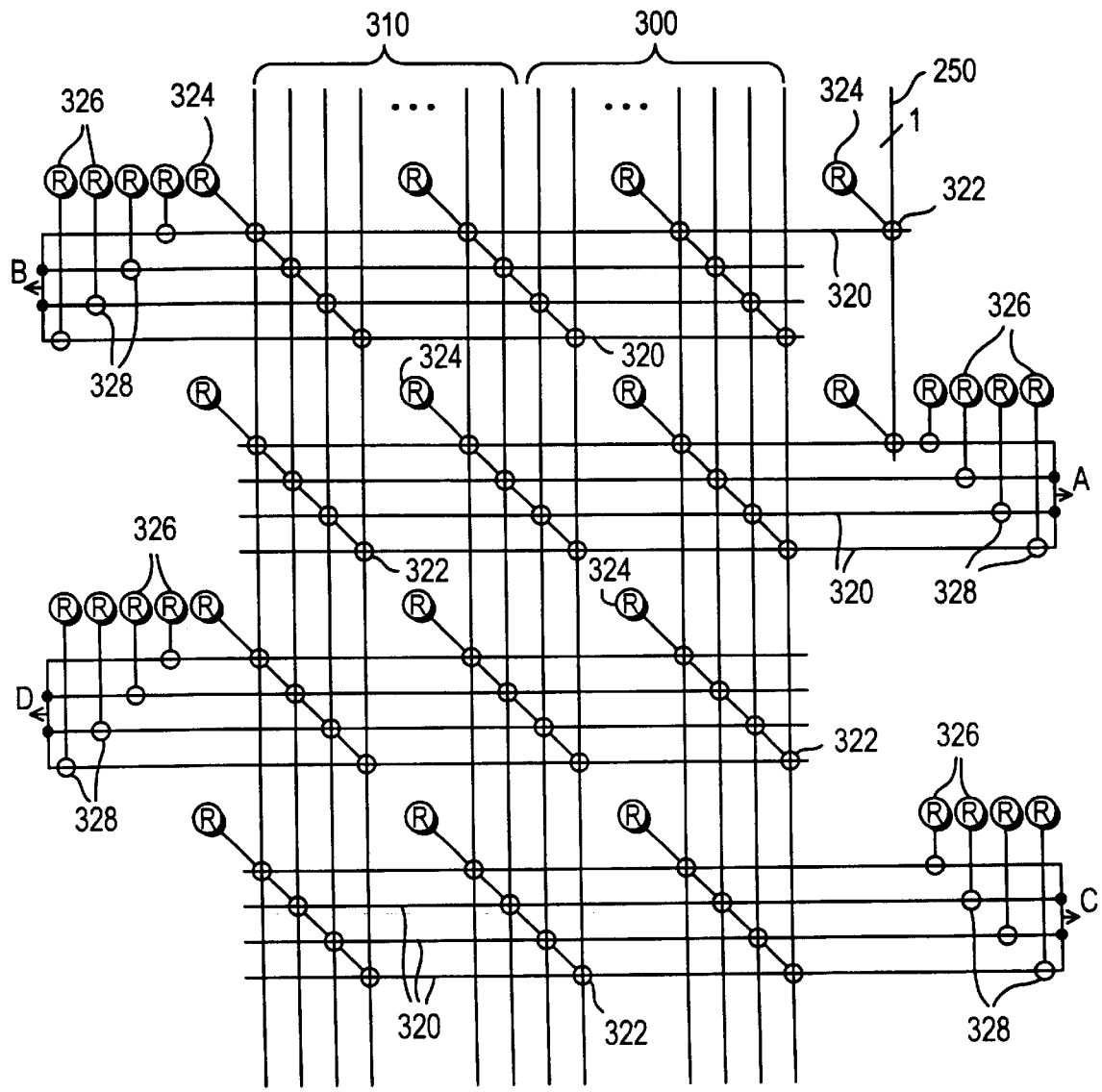
FIG. 4 is a simplified schematic block diagram of still other representative, illustrative interconnection resources for use on the device of FIGS. 1 and 2.

FIG. 4 shows representative conductors that are disposed between horizontally adjacent blocks 20 for bringing signals to those blocks from the other interconnection resources of the device and for providing local interconnections among the regions 30 in those blocks. Each group of such conductors includes 26 conductors 300 (whose signal sources are as shown in FIG. 3), a branch of one of the adjacent HNFL conductors 250, and ten local feedback conductors 310. Five of these local feedback conductors 310 receive their signals from five of the regions 30 in the block 20 to the left of the depicted conductor group. The other five of these conductors 310 receive their signals from five of the regions 30 in the block 20 to the right of the depicted conductor group.

Each region 30 has four main data signal inputs, sometimes referred to as inputs A–D. Any of conductors 300 and 310 can be used as the source(s) of the signals applied to the A and C inputs of the ten regions 30 to the right of those conductors, and as the source(s) of the signals applied to the B and D inputs of the ten regions 30 to the left of those conductors. Alternatively, the depicted HNFL conductor branch 250 can be used as the source of the signal applied to the A input of the top-most region to the right, and as the source of the signal applied to the B input of the top-most region to the left. Four intermediate conductors 320 are associated with each region input A–D. Each of the conductors 250, 300, and 310 that intersect these conductors 320 is connectable to one of the four conductors 320 that is associated with each input A–D. These connections are made by PLCs 322 that are controlled in groups of four by FCEs 324. (Exceptions to the group-of-four groupings are made for the connections to HNFL branch 250.) Thus a single FCE 324 is programmed to connect four conductors 300/310 to the four conductors 320 associated with each input A–D. A final selection of the signal applied to each input A–D is made by programming one of four FCEs 326 associated with that input to enable one of PLCs 328 associated with that input. (Alternatively, the signal on the HNFL branch 250 can be applied to an A or B input by appropriately programming associated FCEs 324 and 326.)

From the foregoing it will be seen that HNFL signals have two possible ways into the logic blocks 20 served by the conductors 300, etc., shown in FIG. 4. One of these ways is the relatively fast routing through elements 276 and 278 in FIG. 3. The other way, for one particular HNFL conductor 250 and the top-most ones of the regions 30 served by the conductors 300 shown in FIG. 4, is the even faster routing via the conductor branch 250 shown in FIG. 4 and the associated elements 322 and 328. Although somewhat slower, the first way is more general-purpose in that it enables any adjacent HNFL signal to get to at least large numbers of the inputs to the logic blocks 20 served by the circuitry shown in FIG. 4. The other, faster way is more limited in that it only works for one of the adjacent HNFL signals and only allows input to one input terminal of one region 30 in each of the logic blocks 20 served by the FIG. 4 circuitry.

Figure 5A:
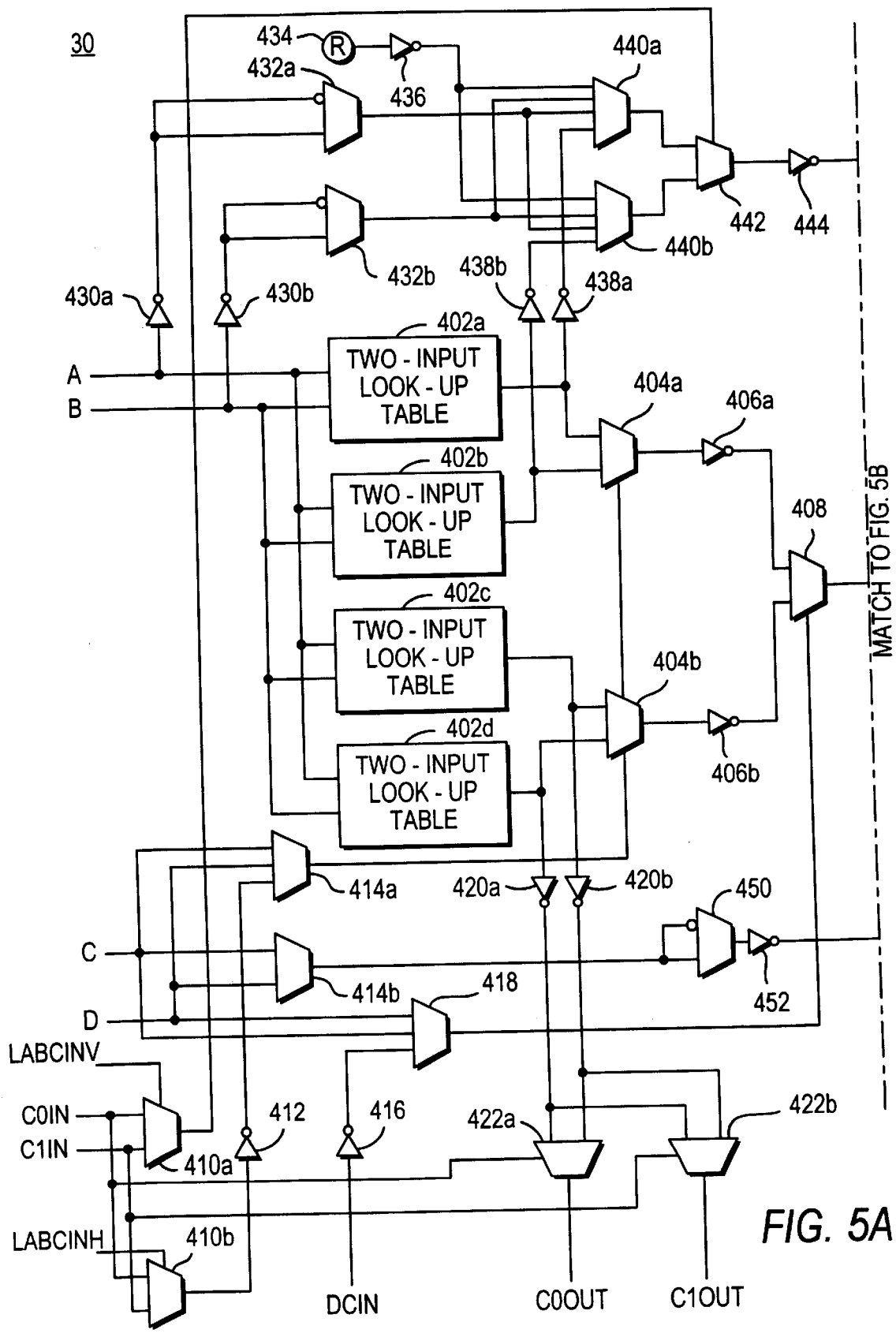
FIGS. 5A and 5B (sometimes referred to collectively as FIG. 5) are a simplified schematic block diagram of representative, illustrative programmable logic and related circuitry for use on the device of FIGS. 1 and 2 in accordance with the present invention.
Figure 5B:
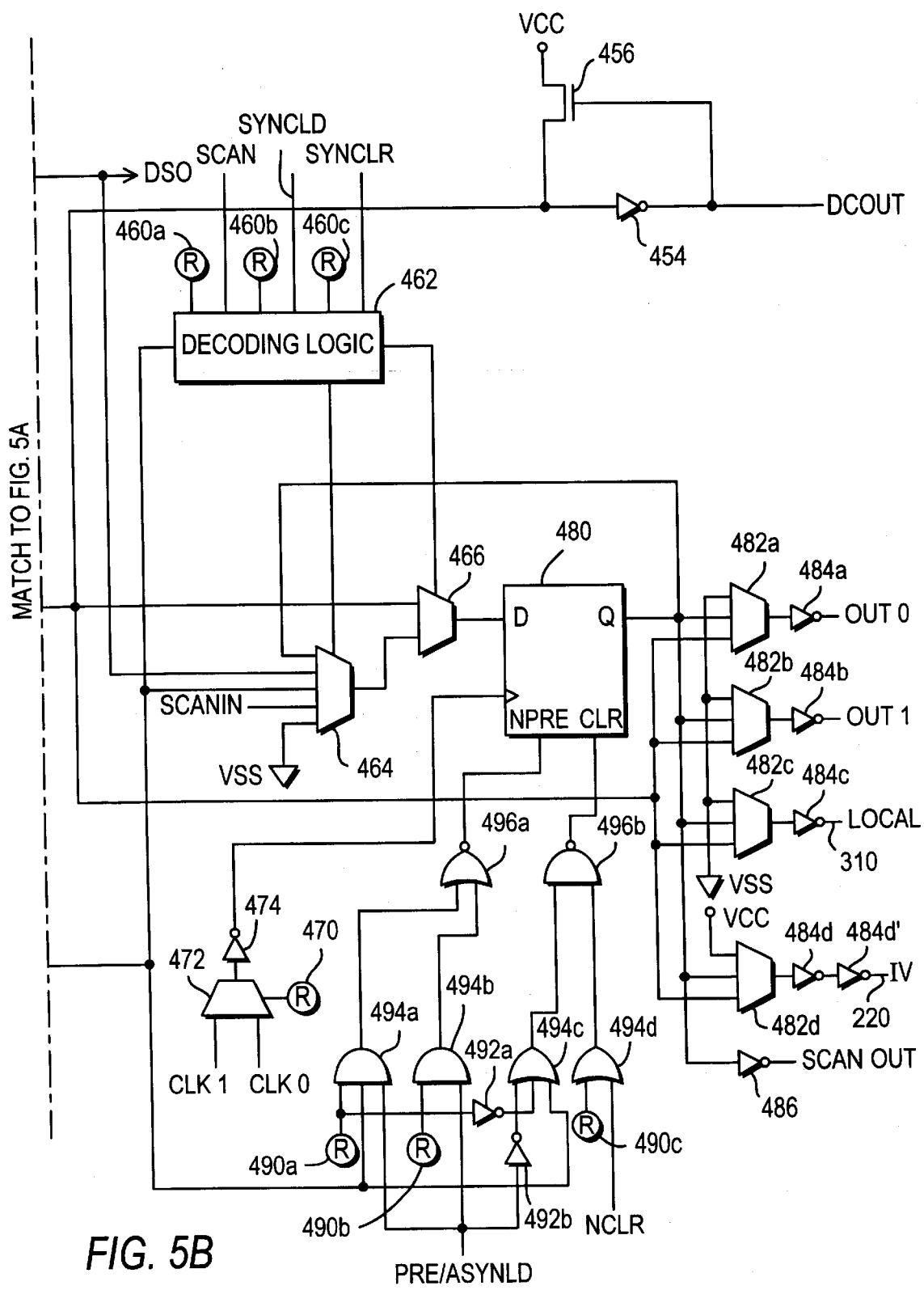

FIGS. 5A and 5B (sometimes referred to collectively as FIG. 5) show an illustrative embodiment of a representative region 30. The core of region 30 is a four-input look-up table (comprising elements 402, 404, 406, and 408) and a register 480. Although augmented with other features that are described below, the fundamental operation of region 30 is as a four-input look-up table which is programmable to produce a look-up table output signal (from PLC 408, which preferably is a multiplexer) which can be any logical combination of inputs A–D. The look-up table output signal can be output directly via any one or more of PLCs 482. Alternatively or in addition, the look-up table output signal can be registered by register 480 and then output via any of PLCs 482 that are not in use for outputting the unregistered look-up table output signal.

Considering representative region 30 in more detail, the first stage of the four-input look-up table logic is constructed as four two-input look-up tables 402a–402d. Each of look-up tables 402 receives region inputs A and B and is programmable to produce an output signal which is any logical combination of those two input signals. The second stage of the four-input look-up table logic is constructed as two PLCs 404a and 404b. PLCs (e.g., multiplexers) 404 can be controlled by (1) the C input to region 30, (2) the D input to region 30, or (3) a carry-in signal selected by PLC 410b. The selection among options (1), (2), and (3) is made by appropriately programming PLC 414a. Option (3) is selected if the region is being used to perform one place of certain binary arithmetic operations (e.g., fast adder, counter, multiplier, and wide parity functions). The selection between options (1) and (2) may be based on signal timing considerations which will be discussed further in connection with elements 406, 408, and 418. The output signals of PLCs 404a and 404b are strengthened by inverting buffers 406a and 406b, respectively.

The last stage of the four-input look-up table logic is performed by PLC (e.g., multiplexer) 408. PLC 408 can be controlled by (1) the C input to region 30, (2) the D input to region 30, or (3) a so-called "direct connect" input DCIN from another adjacent or nearby region 30. The selection among just-mentioned options (1), (2), and (3) is made by appropriately programming PLC 418. Option (3) will be selected if the depicted region 30 is performing a logic function that is based (at least in part) on receiving a direct connect signal from another adjacent or nearby region. These direct connect connections between regions may be used to facilitate the performance of wide fan-in logic functions or the like which require several regions to be connected in series, sometimes referred to as a cascade chain. (See, e.g., U.S. Pat. No. 5,258,668, which is hereby incorporated by reference herein in its entirety, for additional discussion of cascade connections between logic modules on programmable logic devices.) The choice between options (1) and (2) can be based on signal timing considerations.

The signal timing considerations referred to in the two preceding paragraphs can include routing the slowest (i.e., last-to-arrive) of the data signals to be processed by the four-input look-up table logic to the last stage of that logic (i.e., the control input terminal of PLC 408). In this way, the earlier-arriving data signals can be processed by the first two stages of the look-up table logic in order to produce two already-buffered signals at the output terminals of buffers 406a and 406b. Then when the last-to-arrive data signal is received, PLC 408 is immediately able to output the buffer output signal selected by the state of the last-to-arrive signal. By applying the last-to-arrive data signal to the last stage of the look-up table logic, the look-up table output signal can be made available significantly earlier than if the last-to-arrive signal were applied to an earlier stage of the look-up table. This speed-up of the look-up table is further enhanced by placing buffers 406 upstream from PLC 408, rather than having the final look-up table output signal delayed by a buffer downstream from PLC 408.

Above-described elements 414a and 418 allow either input C or input D to be selected as the one to be applied to the final stage of the look-up table. The input C or D that is not thus selected for the final stage can be applied to the next-to-last stage of the look-up table.

Because the direct connect signal DCIN may be relatively late to arrive (e.g., in the event that it is produced near the downstream ends of a relatively long cascade chain), this signal is also among those selectable by PLC 418 for application to the last stage of the look-up table logic. This again helps speed up cascade chains.

Continuing with discussion of other elements in FIG. 5A, if region 30 is being used to perform one place of binary addition, counting, or the like, elements 402a and 402b can be programmed to produce two precursors of the sum of input A, input B, and a carry-in signal (from PLC 410b). PLC 404a is then controlled by the carry-in signal (via PLC 414a) to select the appropriate one of these two precursors as the sum-out signal. PLC 408 is controlled to pass the sum-out signal to the circuitry of FIG. 5B. (This state of PLC 408 can be achieved by using the D input to the region to control PLC 408. Specifically, setting the D input to ground causes PLC 408 to select its top input.) Elements 402c and 402d are programmed to produce two precursors of the carry-out that results from summing input A, input B, and the carry-in signal. These two precursors are respectively inverted by buffers 420a and 420b and applied in parallel to the two data inputs of each of PLCs (e.g., multiplexers) 422a and 422b. PLCs 422a and 422b respectively select precursors to output as C0OUT and C1OUT based on the C0IN and C1IN signals applied to region 30. The C0OUT and C1OUT signals of each region 30 are the C0IN and C1IN signals of the next region 30 in the carry chain. Two carry signals are thus propagated in parallel as part of circuitry for speeding up carry chains. As stated above, in order to facilitate the long carry chains needed to implement the adder tree required to perform multiplication, the carry signals output by each region 30 are fed to the carry inputs of the region 30 immediately below, even if that next region 30 is in a different block 20.

Elements 450 and 452 are part of circuitry for allowing register 480 (FIG. 5B) to be used in what is called "lonely register" mode. This means that if register 480 is not needed for registering the look-up table output signal from PLC 408, the register can be alternatively used to register input C or input D. The C/D selection is made by PLC 414b. PLC 450 is programmed to propagate either the true or complement of the selected signal. Buffer 452 inverts and amplifies the selected signal.

Turning now to the portion of the representative region 30 circuitry that is shown in FIG. 5B, elements 454 and 456 allow the look-up table output signal (from PLC 408 in FIG. 5A) to be output as a direct connect output signal DCOUT of the region. The DCOUT signal of each region 30 is the DCIN signal of the next region in a cascade chain or series of regions. Element 454 is an inverting buffer for the DCOUT signal, and element 456 is part of level-restoring circuitry for that signal.

Elements 460 and 462 are circuitry for controlling the states of PLCs 464 and 466 based on the programming of elements 460, the logical state of the output signal of buffer 452 (FIG. 5A), and the logical states of the SCAN, SYNCLD, and SYNCLR signals. The SCAN signal is a device-wide signal for placing the device in a scan test mode in which register 480 and other registers on the device are effectively connected in scan chains in order to read out their contents and thereby more readily test the device for proper operation. Thus when the SCAN signal is asserted, decoding logic 462 controls PLCs 464 and 466 to apply the SCANIN signal to register 480. The SCANIN signal of each region 30 is the SCANOUT signal of the preceding region or other register circuitry in a scan chain. The Q output signal of register 480 is output via inverting buffer 486 as the SCANOUT signal of region 30.

SYNCLD and SYNCLR are signals that are preferably selected on a block-wide basis for the block 20 that includes region 30. These signals are used to cause decoding logic 462 to apply signals suitable for synchronous loading or synchronous clearing of register 480. For example, VSS (ground or logic 0) may be connected to the D input terminal of register 480 via PLCs 464 and 466 to cause synchronous clearing of the register. Other states of the inputs to logic 462 and the consequent outputs from that logic can cause register 480 to re-register its output signal, to register the so-called "direct sum-out" signal DSO from buffer 444 (FIG. 5A), or to operate in lonely register mode in which it registers the output signal of buffer 452 (FIG. 5A).

Elements 470, 472, and 474 allow either of two clock signals CLK0 or CLK1 to be selected as the clock signal applied to the clock input terminal of register 480. FCE 470 is programmed to cause PLC 472 to select one of the two clock signals, which is then inverted by inverting buffer 474 for application to register 480.

Elements 490–496 are programmable and otherwise operable to control register 480 to perform various preset, asynchronous load, and clear operations. Elements 490 are FCEs, elements 492 are inverters, elements 494a and 494b are AND gates, elements 494c and 494d are OR gates, element 496a is a NOR gate, and element 496b is a NAND gate. The PRE/ASYNLD signal is an asynchronous load control signal. The NCLR signal is a clear signal.

Each of PLCs 482a–c is programmable by FCEs (not shown) to output either VSS (logic 0), the Q output signal of register 480, or the unregistered look-up table output signal from PLC 408 (FIG. 5A). PLC 482d is similar, except that instead of VSS, it can output VCC (logic 1). The output signal of PLC 482a is applied by inverting buffer 484a to a first output lead OUT0 of region 30. The output signal of PLC 482b is applied by inverting buffer 484b to a second output lead OUT1 of region 30. The output signal of PLC 482c is applied by inverting buffer 484c to a LOCAL output lead of region 30. The output signal of PLC 482d is applied by inverting buffers 484d and 484d' to an interleaved vertical ("IV") conductor 220.

The LOCAL signal is applied to a local feedback conductor 310 to the left or right of the block 20 that includes region 30. In particular, the LOCAL outputs of half the regions 30 in each block 20 are applied to respective ones of the conductors 310 to the left of that block and the LOCAL outputs of the other half of the regions in each block are applied to respective ones of the conductors 310 to the right of that block. In a manner somewhat like the LOCAL output signals, the IV output leads 220 of half the regions 30 in each block 20 extend upwardly from that block, and the IV output leads 220 of the other half of the regions extend downwardly from that block.

Elements 430, 432, 434, 436, 438, 440, 442, and 444 are provided as part of circuitry to facilitate and speed up the performance of multiplication operations by region 30. This circuitry is not part of the present invention and will not be described further herein. It is, however, further described in copending, commonly-assigned U.S. patent applications Ser. Nos. 60/142,403 and 09/517,350, filed Jul. 6, 1999 and concurrently herewith, respectively, which are hereby incorporated by reference herein in their entireties.

Figure 6:
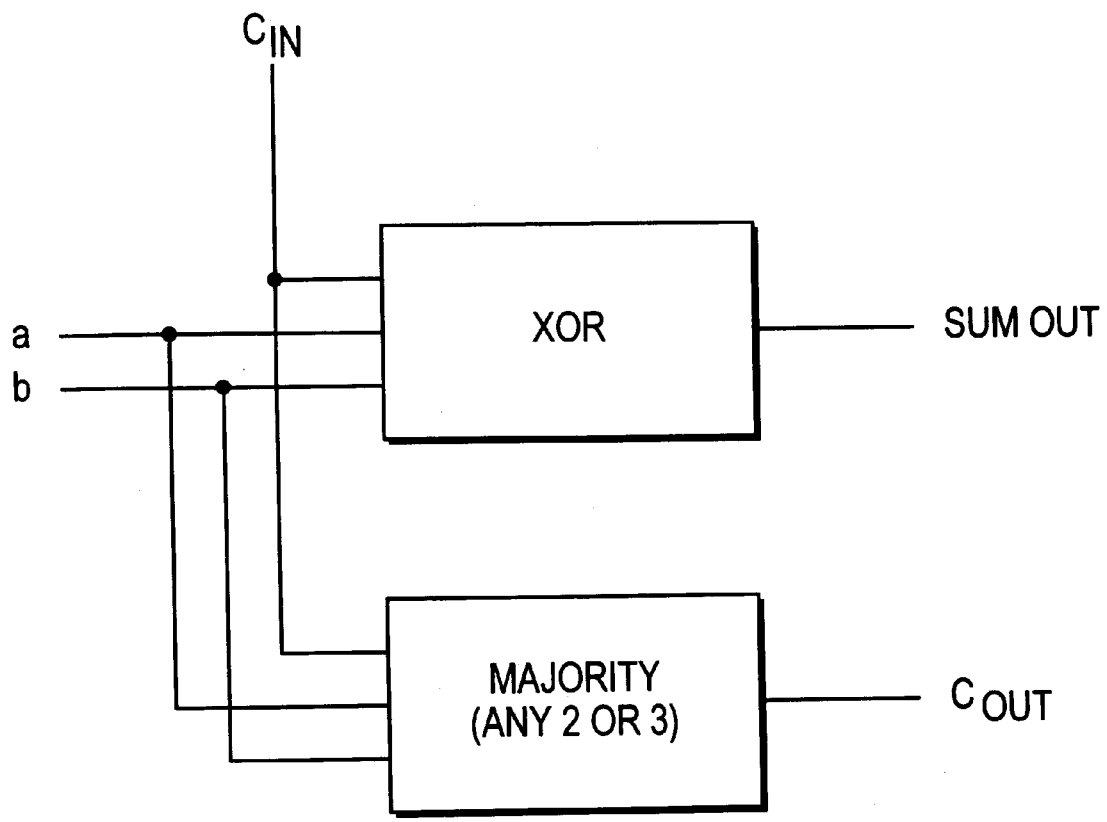
FIG. 6 is a schematic diagram of logic for performing addition with carry, showing the separate generation sum and carry signals.

The present invention is possible because, as illustrated in FIG. 6, when a logic function is calculated, the carry signal is generated separately from the output signal. In FIG. 6, which shows a two-bit addition, the output SUMOUT is the result of an XOR 600 of inputs a and b and carry-in signal $c_{IN}$, while the carry-out signal $C_{OUT}$ is calculated based on a "majority" function of the same three inputs (the output $C_{OUT}$ follows the majority—i.e., any two or three—of the three inputs). Therefore, if the $C_{OUT}$ signal could be calculated faster, it can be provided faster to the respective $c_{IN}$s of the various logic functions.

Figure 7:
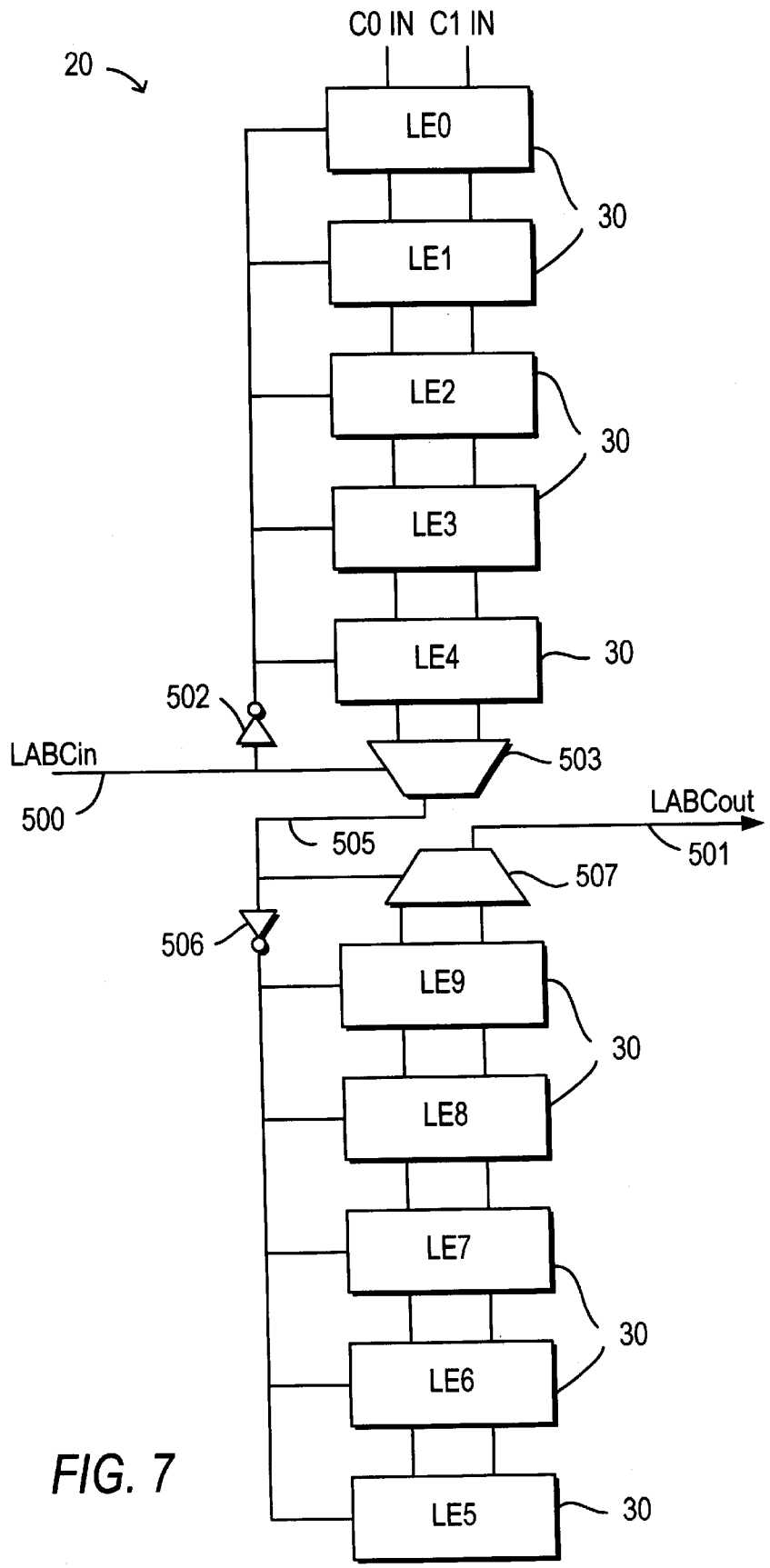
FIG. 7 is a simplified schematic diagram of the layout of a plurality of logic regions into a group according to a preferred embodiment of the invention, showing the arrangement of carry signal conductors and the carry-select multiplexers.
Figure 9:
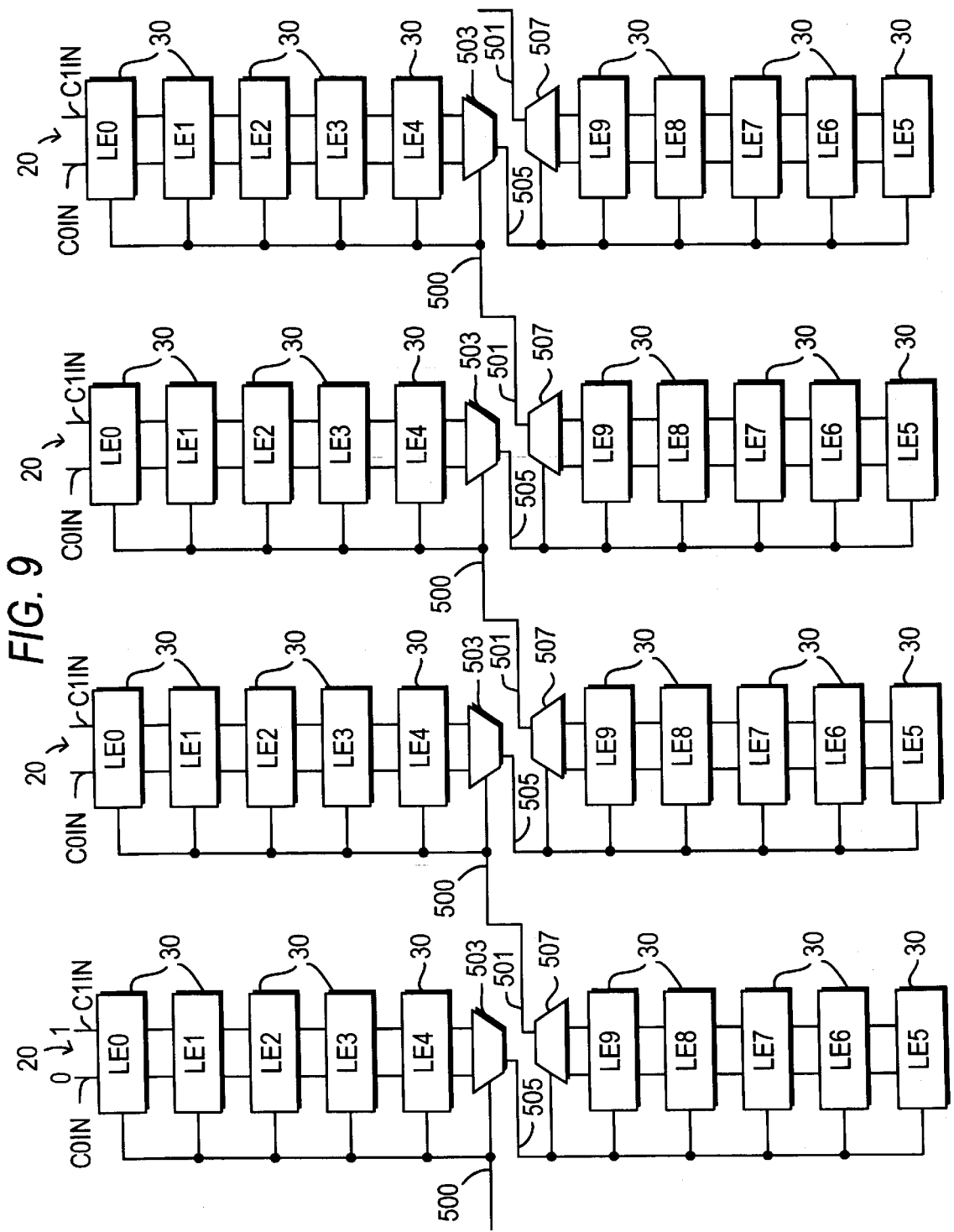
FIG. 9 is a simplified schematic diagram of a plurality of groups as in FIG. 7, showing horizontal propagation of carry signals.

FIGS. 7 and 9 show the propagation of carry signals within one group 20 of logic regions 30. For simplicity, only one carry-in signal 500 and one carry-out signal 501, which propagate horizontally, are shown, it being understood that there can also be vertical carry-in and carry-out signals to and from group 20, as discussed above.

As can be seen, the group carry-in signal 500 (designated LABCin in the drawing) is fed to each of the first five regions 30 in group 20 (after inversion at 502 as appropriate), as well as to first group carry multiplexer 503. Also carried in to the first region 30 (designated LE0) are two carry signals designated C0IN and C1IN, which preferably are set to "0" and "1," respectively.

While signals C0IN and C1IN could come from another group 20 if the group 20 that is depicted is not the first group in the carry chain, waiting for those signals would negate much if not all of the advantage of the present invention. Moreover, it does not matter whether these inputs are set to "0" and "1" or to "1" and "0," and therefore it does not matter if they come from an actual calculation or are merely "hardwired" or fixed arbitrarily. Therefore, speed and simplicity dictate that C0IN and C1IN be fixed. All that is necessary is that one knows how the signals are fixed so that the group carry-in can be used to make a proper selection, as described below.

Figure 8:
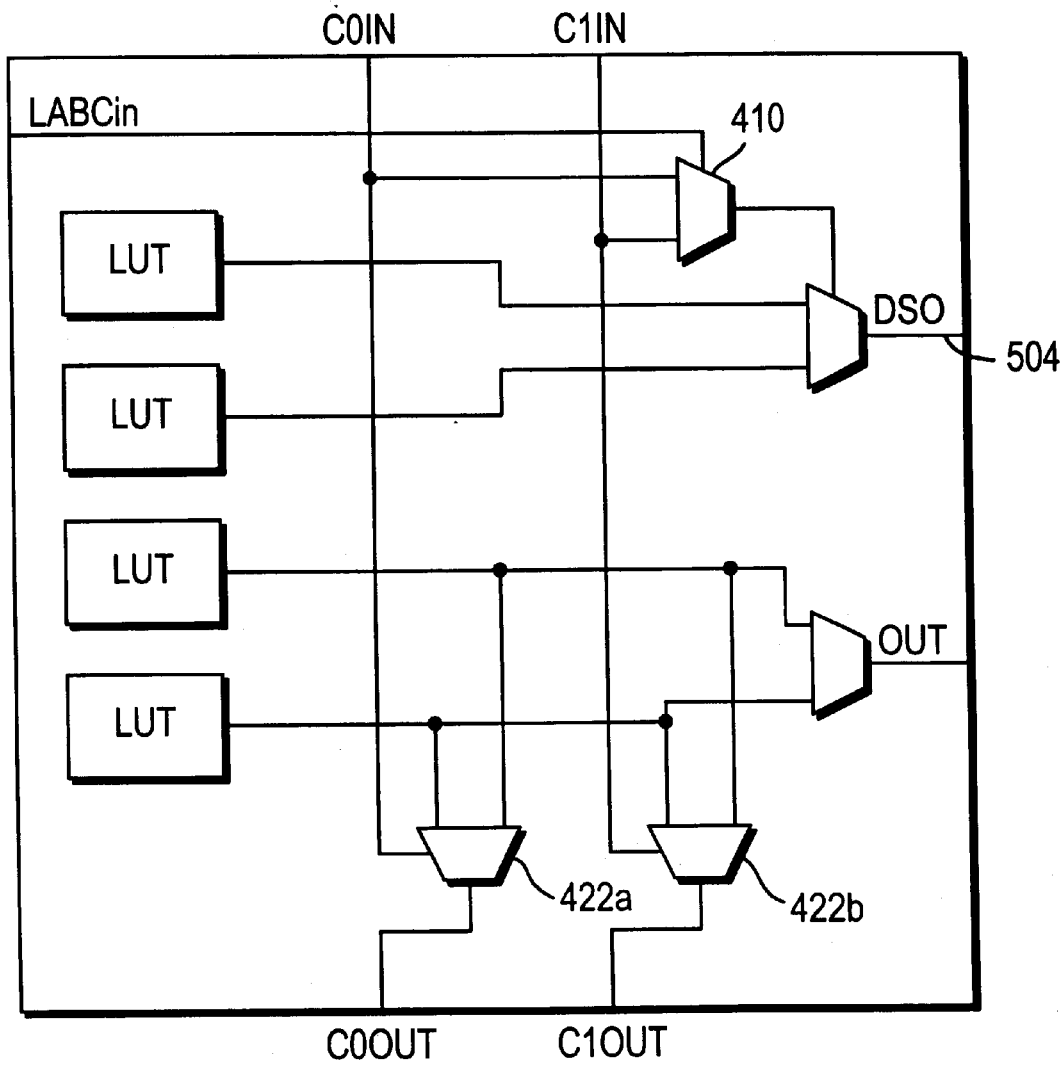
FIG. 8 is a simplified schematic diagram of the interior of one of the logic regions of FIG. 7.

As can be seen in FIG. 8, the signals C0IN and C1IN are used to control PLCs 422a,b to determine which of two possible outputs of the look-up table logic will become the carry-out signal C0OUT of this region 30 and which will become the carry-out signal C1OUT of this region 30 (and the carry-in signals C0IN and C1IN of the next region 30). At the same time, the value of the LABCin signal 500 is used by PLC 410 to select between carry-in signals C0IN and C1IN for the purpose of completing the logic function of group 20 and providing output 504 (designated DSO), based on inputs A–D (not shown in FIG. 7) and the carry signals.

After the carry signals have propagated through preferably the first five regions 30 (designated LE0-LE4) of group 20, the carry-out signals of the fifth region 30 (designated LE4) preferably are input to first group carry multiplexer 503, whose output 505 is the "group" carry-in signal (after inversion at 506 as appropriate) for the second half of group 20—i.e., for the sixth through tenth regions 30 (designated LE5–LE9) in group 20, as well as the control input to second group carry multiplexer 507.

As in the case of the first five regions 30 (designated LE0-LE4), carry-in signals C0IN and C1IN, as well as "group" carry-in signal 505 are used to allow each of the second five regions 30 (designated LE5–LE9) to complete its logic functions, and also, through second group carry multiplexer 507, to determined the value of group carry-out signal 501 (designated LABCout), which serves as the group carry-in signal to the next group 20.

As can be seen in FIG. 7, the regions 30 in group 20 are arranged so that the most significant region 30 (designated LE4) of the first five regions 30 and the most significant region 30 (designated LE9) of the second five regions 30 are adjacent one another near the center of the column formed by regions 30. In this way, group carry-out signal 501 (designated LABCout) can be propagated horizontally along the center of each row of groups 20. That means that when group carry-out signal 501 reaches the next group 20 in a long-carry-chain, serving as that group's group carry-in signal 500, it needs to propagate from group to group only as far as the horizontal distance between groups. This very short carry path allows very fast propagation throughout the carry chain. Although each group carry-in must then propagate "backwards" within each subgroup of five regions 30 to allow each region to complete its logic functions, that propagation delay occurs substantially simultaneously for all subgroups. This is clearly better than the alternative of having the carry signals propagate in the traditional way through each region, significantly delaying propagation of the carry signals to later groups. What is important is that the carry signals reach all subgroups as quickly as possible, so that the overall completion time for all logic functions in the carry chain is as short as possible.

It should be recognized that although in theory logic regions 30 in group 20 should be divided into two subgroups of five regions 30 each, because that minimizes the propagation time through the subgroups, in practice, regions 30 are fabricated in pairs. Therefore, in a preferred embodiment (not shown), each group 20 is broken into two subgroups of four and six regions 30, respectively.

It also should be recognized, however, that it would be within the scope of the present invention to arrange regions 30 linearly in group 20 with the most significant region 30 at one end. It should also be recognized that whether regions 30 are arranged as shown in FIGS. 7 and 9, or linearly with the most significant region 30 at one end, first group carry multiplexer 503 is optional. In either arrangement, first group carry multiplexer 503 could be omitted, in which case group carry-in signal 500 would be carried in to all regions 30 in group 20, rather than having a separate "group" carry signal for the five more significant regions 30. Even without multiplexer 503, having a center carry-out, and therefore a center carry-in in the next group, would minimize the propagation of the carry in that next group, and therefore still provides an advantage. Similarly, as discussed above, there is still an advantage even if group 20 is not broken into smaller groups, and remains arranged linearly, but the carry signals are propagated horizontally from the end of each group to the end of the next group which has received the internal carry generation results of its own group and uses the carry signal to make a final selection.

Finally, although FIG. 9 shows the carry signal being propagated from each column or group to its adjacent column or group, it is preferred that the carry-out signal of each propagating group be propagated to a group separated from that propagating group by one intervening group. This is because in the device as depicted in FIGS. 1–5, the interconnection resources shown in FIGS. 3 and 4 are shared by pairs of adjacent groups 20. In order to avoid competition for those resources in completing the carry-out connections, the carry chains described herein (and depicted in FIG. 9 as using adjacent groups 20) preferably are laid out by the programming software using every other group 20. Therefore, although logically adjacent, the various groups 20 depicted in FIG. 9 in fact are not adjacent (although they are close together, separated by only one intervening group 20).

As stated above, inputs A–D for each region 30 in a single group 20 of device 10 frequently arrive at all regions 30 in group 20 substantially simultaneously (except in those cases where an output of one region 30 is an input to another region 30 in the same group 20). However, in the absence of the features of the present invention, if the regions 30 of a group 20 are used to form a carry chain, the logic operations of the more significant regions 30 in that group 20 cannot complete until the operations of the less significant regions 30 in that group 20 complete, to provide the carry signals to the more significant regions 30. Although the carry look-ahead circuitry of the present invention as described herein also requires some time for propagation of the carry signals, that time is less than the time for carrying the signals through the full carry chain. Therefore, the logic operations of the more significant regions 30, which are ready to complete soon after arrival of inputs A–D but for the need to await the carry signals, can complete sooner as a result of the provision of carry look-ahead circuitry in accordance with this invention.

In a second preferred embodiment of the invention, instead of providing group carry signals to provide a look-ahead feature, a "carry-skip" feature could be provided whereby the carry signal from a first region 30 is provided to a second region 30 separated from the first region 30 by one intervening region 30. Look-ahead circuitry in each region 30 according to this embodiment could use the carry value from the region two behind it (from which it receives the carry), as well as other inputs, to predict what the carry value out of the intervening region 30 (which the second region needs for its logic operations) would have been.

Figure 10:
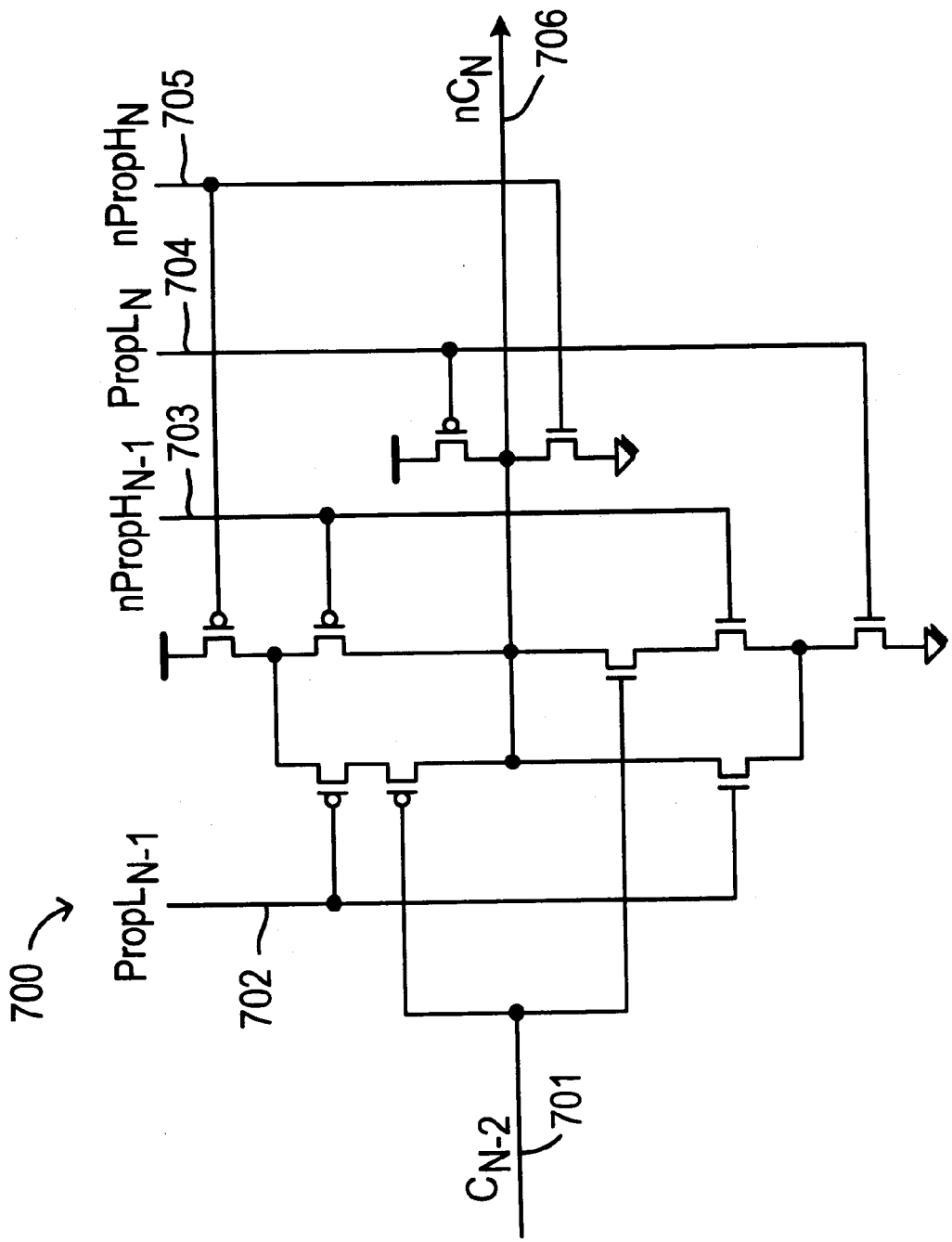
FIG. 10 is a simplified schematic diagram of circuitry that may be added to a logic region in a second preferred embodiment of the invention.

In accordance with such a second preferred embodiment, where each region 30 is performing two-bit logic, circuitry such as circuitry 700 (FIG. 10) can be added to each region 30. The inputs to "two-bit carry-skip" circuitry 700 are the carry 701 (designated $C_{N-2}$) from the region 30 immediately preceding the immediately preceding region 30, a signal 702 (designated $PropL_{N-1}$) signifying whether or not a low carry-in at the immediately preceding region 30 would be propagated, a signal 703 (designated $nPropH_{N-1}$) signifying whether or not a high carry-in at the immediately preceding region 30 would be propagated, a signal 704 (designated $PropL_N$) signifying whether or not a low carry-in at the current region 30 would be propagated, and a signal 705 (designated $nPropH_N$) signifying whether or not a high carry-in at the current region 30 would be propagated. The output of this two-bit carry-skip circuitry is the carry-out signal 706 (designated $nC_N$) of the current region 30, which is calculated faster (i.e., in about 50% of the time) than it would be during the logic operations of the current region 30. Carry-out signal 706 is then provided to a subsequent region 30, immediately following the next region 30. The subsequent region 30 can use signal 706 for performing the logic operations of that subsequent region 30 and also in the carry-skip circuitry 700 of that subsequent region 30 for generating the carry-out signal of that subsequent region 30.

Figure 11:
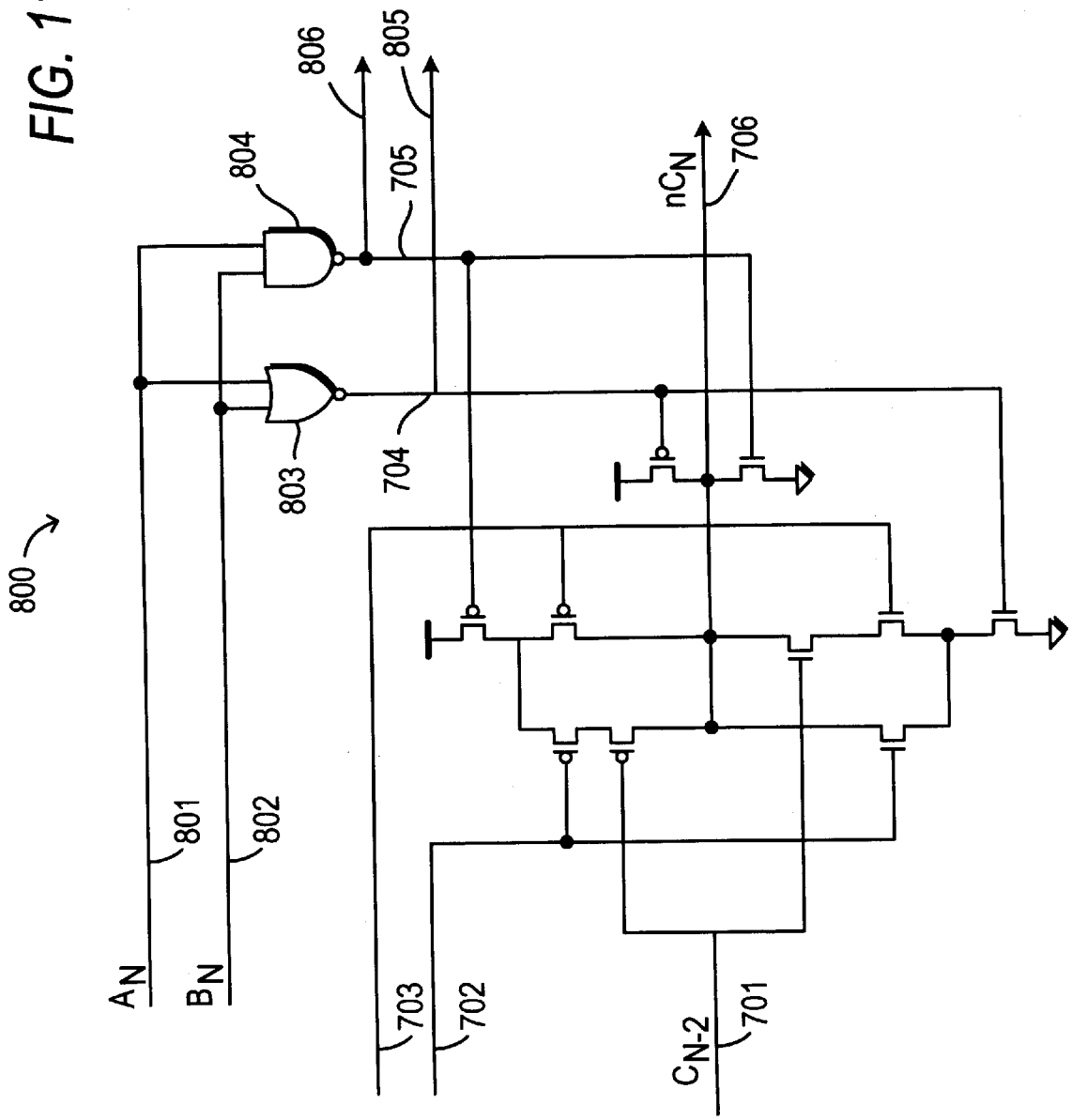
FIG. 11 is a simplified schematic diagram of a particular implementation of the circuitry of FIG. 10.

A particularly preferred embodiment 800 of circuitry 700, showing how propagation signals 702–705 are generated in the case of two-bit adder chain, is shown in FIG. 11. Bits $A_N$ and $B_N$ are provided, in addition to being provided to the logic inputs of region 30 containing circuitry 800, to inputs 801, 802. Bits $A_N$ and $B_N$ are NORed in NOR gate 803 to provide $PropL_N$ signal 704 and NANDed in NAND gate 804 to provide $nPropH_N$ signal 705. Signals 704, 705 are output at 805, 806, respectively, where they are propagated, respectively, as signals $PropL_{N-1}$ and $nPropH_{N-1}$ to respective inputs 702, 703 of the next region 30.

The truth table for the values of $PropL_N$ and $nPropH_N$ as implemented by gates 803, 804 in circuitry 800 is as follows:

| $A_N$ | $B_N$ | $PropL_N$ | $nPropH_N$ |
|---|---|---|---|
| 0 | 0 | 1 | 1 |
| 0 | 1 | 1 | 0 |
| 1 | 0 | 1 | 0 |
| 1 | 1 | 0 | 0 |

Thus, if $A_N$ and $B_N$ both are low, their sum will be low, and if the carry-in is low, the carry-out will be low. Even if the carry-in is high, the sum will be high but the carry-out still will be low. Therefore, a high carry-in will never propagated but a low carry-in always will be propagated, so that both $PropL_N$ and $nPropH_N$ are high.

If one of $A_N$ and $B_N$ is low and the other is high, their sum will be high, but the carry-out will be low if the carry-in is low. Therefore a low carry-in will be propagated, so that $PropL_N$ is high. If the carry-in is high, the carry-in and the high sum will generate a high carry. Therefore, a high carry-in is propagated, so that $nPropH_N$ is low.

If $A_N$ and $B_N$ both are high and the carry-in is low, the sum will be low but will generate a high carry-out. Therefore a low carry-in will not be propagated, so that $PropL_N$ is low. If the carry-in is high, both the sum and the carry-out are high. Therefore, a high carry-in is propagated, so that $nPropH_N$ is low.

This gives rise to the following truth table for circuitry 800 as a whole:

| $PropL_{N-1}$ | $nPropH_{N-1}$ | $PropL_N$ | $nPropH_N$ | $nC_N$ |
|---|---|---|---|---|
| X | X | 0 | 0 | 0 |
| X | X | 1 | 1 | 1 |
| 0 | 0 | 1 | 0 | 0 |
| 1 | 1 | 1 | 0 | 1 |
| 1 | 0 | 1 | 0 | $nC_{N-2}$ |
| X | X | 0 | 1 | ? |
| 0 | 1 | X | X | ? |

Thus, if $PropL_N$ is low, a low carried out of the N–1st region will not be propagated by the Nth region, and if $nPropH_N$ is low, a high carried out of the N–1st region will be propagated by the Nth region, so that if $PropL_N$ and $nPropH_N$ are both low, then regardless of the states of $PropL_{N-1}$, $nPropH_{N-1}$ and $C_{N-2}$, $nC_N$, the complement of the value carried out of the Nth region, will be low.

If $PropL_N$ is high, a low carried out of the N–1st region will be propagated by the Nth region, and if $nPropH_N$ is high, a high carried out of the N–1st region will not be propagated by the Nth region, so that if $PropL_N$ and $nPropH_N$ are both high, then regardless of the states of $PropL_{N-1}$, $nPropH_{N-1}$ and $C_{N-2}$, $nC_N$, the complement of the value carried out of the Nth region, will be high.

If $PropL_N$ is high, a low carried out of the N–1st region will be propagated by the Nth region, and if $nPropH_N$ is low, a high carried out of the N–1st region also will be propagated by the Nth region, so that if $PropL_N$ is high and $nPropH_N$ is low, then the Nth region will propagate whatever carry value is carried from the N−1st region, and one must look to of the states of $PropL_{N−1}$, $nPropH_{N−1}$ and $C_{N−2}$. If both $PropL_{N−1}$ and $nPropH_{N−1}$ are low, then regardless of the value of $C_{N−2}$, the N−1st region will always propagate a high carry-out, so that $nC_N$, the complement of the value carried out of the Nth region, will be low. If $PropL_{N−1}$ is high and $nPropH_{N−1}$ is high, the N−1st region will always propagate a low carry-out, so that $nC_N$, the complement of the value carried out of the Nth region, will be high. If $PropL_{N−1}$ is high and $nPropH_{N−1}$ is low, that means that like the Nth region, the N−1st region will propagate either a low or a high, so that whatever is carried out of the N−2nd region will be carried out of the N−1st region and then out of the Nth region, meaning that $nC_N$ will be the complement of $C_{N−2}$.

The following situations are indeterminate:

If $PropL_N$ is low and $nPropH_N$ is high, then the Nth region will not propagate either a low or high carry. This means that regardless of the values of $PropL_{N−1}$ and $nPropH_{N−1}$, the value of $nC_N$ cannot be predicted. Similarly, If $PropL_{N−1}$ is low and $nPropH_{N−1}$ is high, then the N−1st region will not propagate either a low or high carry. This means that regardless of the values of $PropL_N$ and $nPropH_N$, the value of the carry out of the N−1st region cannot be predicted, and therefore $nC_N$ also cannot be predicted. In these situations, it is necessary to wait for the actual carry value to be determined.

It is also possible to calculate carry values in advance mathematically. The $i^{th}$ carry $c_i$ can be written as a function of inputs $a_i$ and $b_i$, and the original carry-in $c_0$. One can define a "generate" function $g_{i−1}=a_{i−1}b_{i−1}$, and a "propagate" function $p_{i−1}=a_{i−1}+b_{i−1}$. Expanding recursively yields:

$$c_i = g_{i−1} + p_{i−1}g_{i−2} + p_{i−1}p_{i−2}g_{i−3} + \ldots + p_{i−1}p_{i−2} \ldots p_1 g_0 + p_{i−1}p_{i−2} \ldots p_1 p_0 c_0$$

Figure 12:
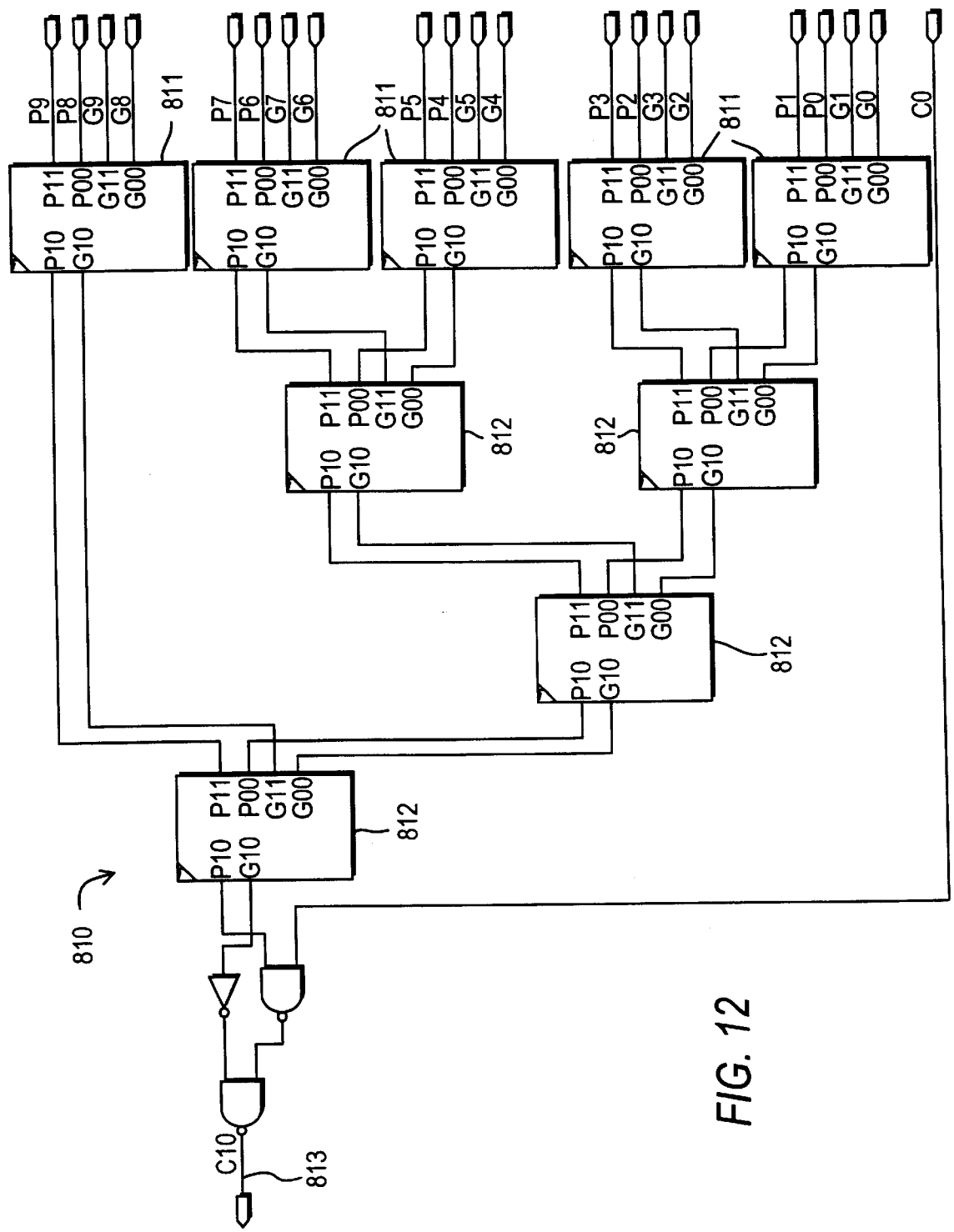
FIG. 12 is a simplified schematic diagram of logic for predicting carry values according to a third preferred embodiment of the invention.
Figure 13:
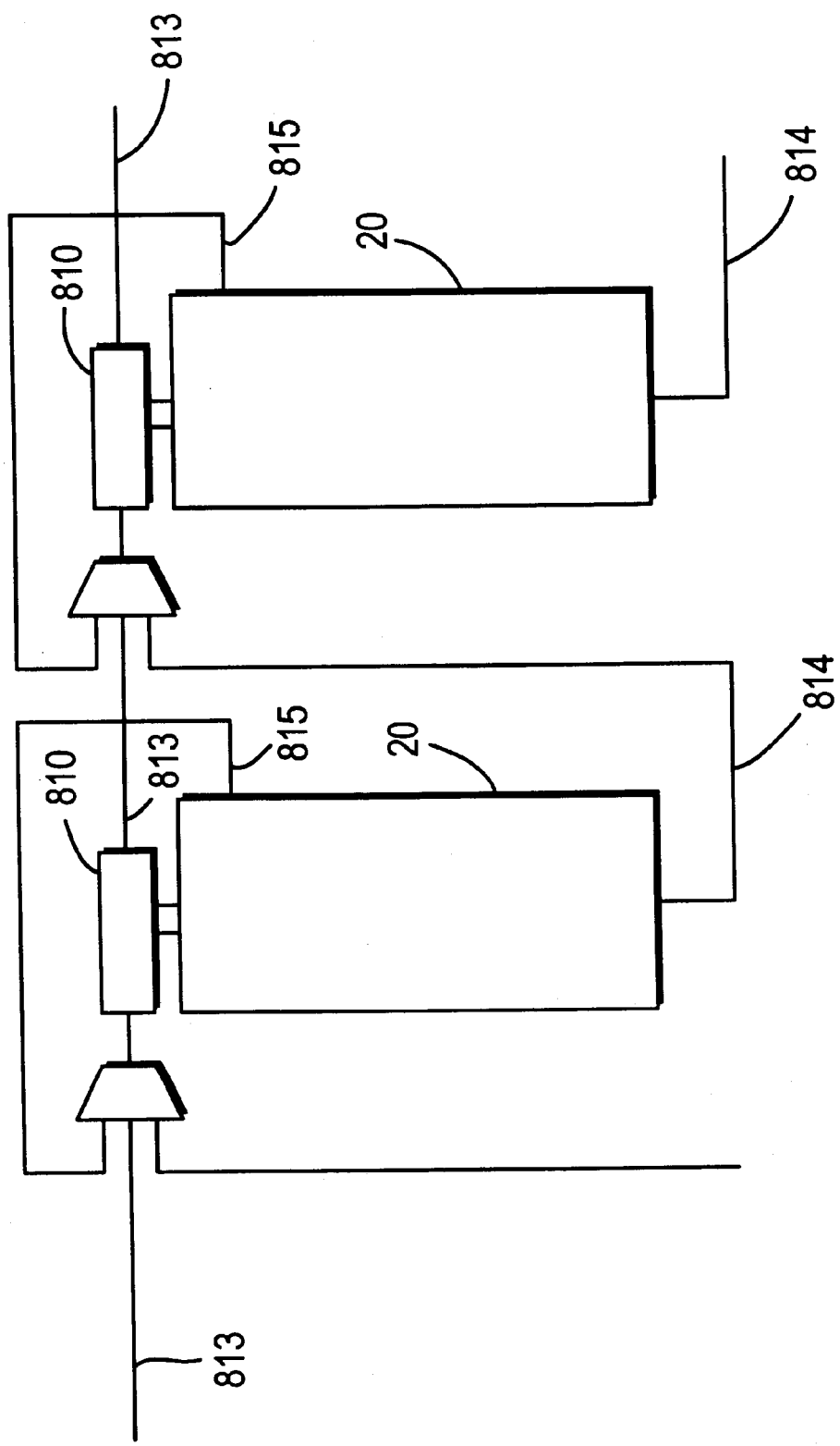
FIG. 13 is a simplified schematic diagram of a portion of a programmable logic device incorporating the embodiment of FIG. 12.

This function can be implemented in known logic tree 810 as depicted in FIG. 12. Each functional block 811 takes as inputs $g_i, p_i, g_j, p_j$ and outputs $g_j+p_jg_i$ and $p_jp_i$. Each functional block 812 takes as inputs $G_{ij}$, $P_{ij}$, $G_{j+1,k}$ and $P_{j+1,k}$ and outputs $P_{i,k}=P_{i,j}P_{j+1,k}$ and $G_{i,k}=G_{j+1,k}+P_{j+1,k}G_{i,j}$, where $G_{0,1}=g_1+p_1g_0$ and $P_{0,1}=p_1p_0$. One such logic tree 810 is provided preferably at the top of each group 20 as shown in FIG. 13, where 813 is the carry output of each group 20, 814 is the carry output of the most significant region 30 in group 20, and 815 is the register output of group 20. As discussed above in connection with other embodiments, trees 810 and carries 813 preferably are in the same row for all groups 20 to minimize the carry propagation distances between groups.

Figure 14:
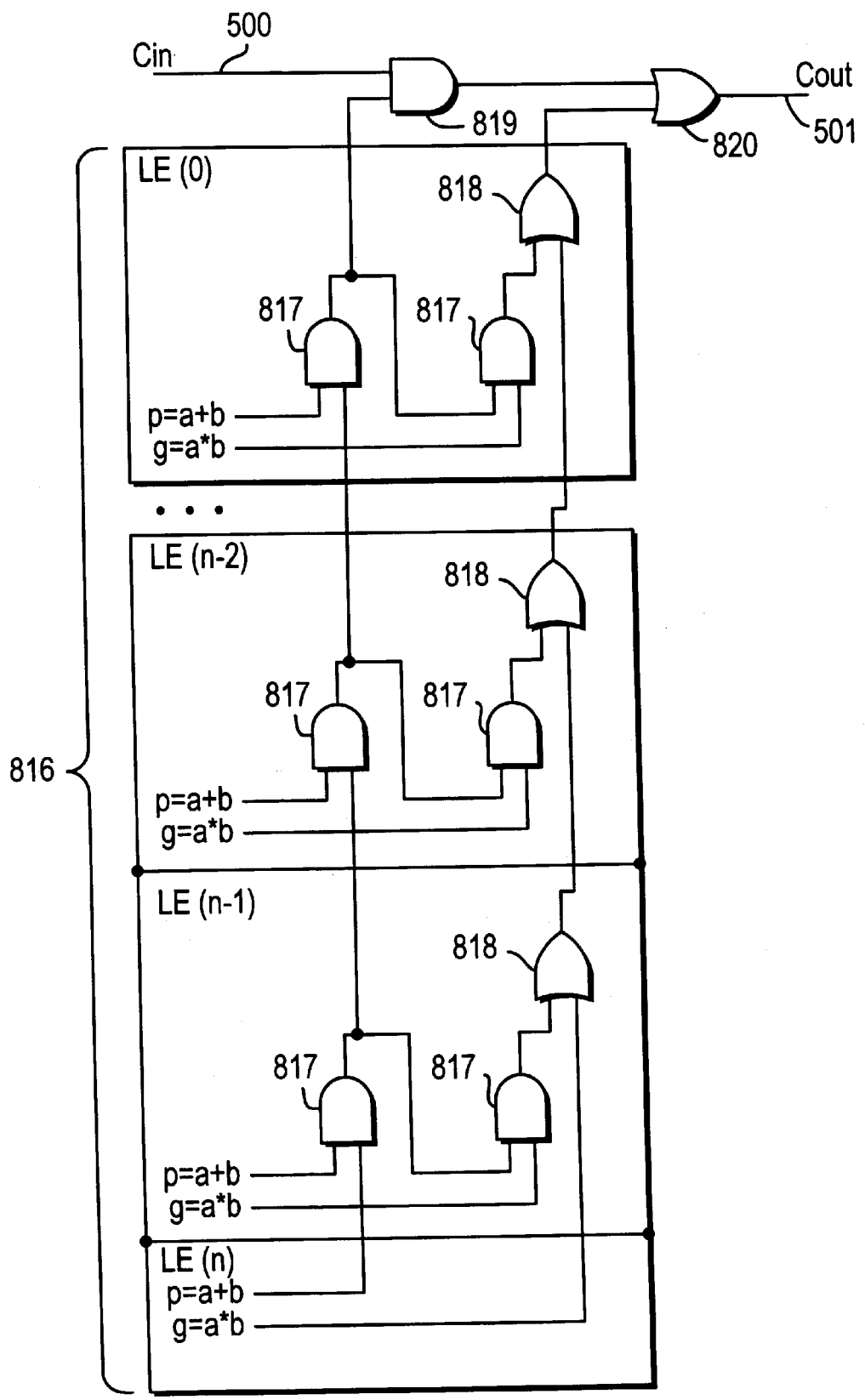
FIG. 14 is a simplified schematic diagram of logic for predicting carry values according to a fourth preferred embodiment of the invention.

However, each region 30 already generates $g_i$ and $p_i$ when it calculates its own carry-out. Therefore, reproducing logic for that purpose in tree 810 may be inefficient. Instead, in a fourth preferred embodiment of the invention, additional logic 816 in the form of two AND gates 817 and one OR gate 818 can be added to each region 30, with the exception of the most significant region 30 in each group 20, in the configuration shown in FIG. 14. One additional AND gate 819 and one additional OR gate 820 as shown in FIG. 14, combines the group carry-in 500 with the output of additional logic 816 to produce group carry-out 501. Again, for all groups 20, group carry-in 500, gate 820 and group carry-out 501 are preferably in the same row to minimize carry propagation distances between groups.

The fourth embodiment has an advantage over the third embodiment in that it uses fewer routing resources and facilitates regular layout of logic elements on programmable logic device 10.

The first, second, third and fourth embodiments of the invention all function in long carry chains for performing arithmetic operations. However, only the first embodiment of the invention will function with any generic logic function.

Figure 15:
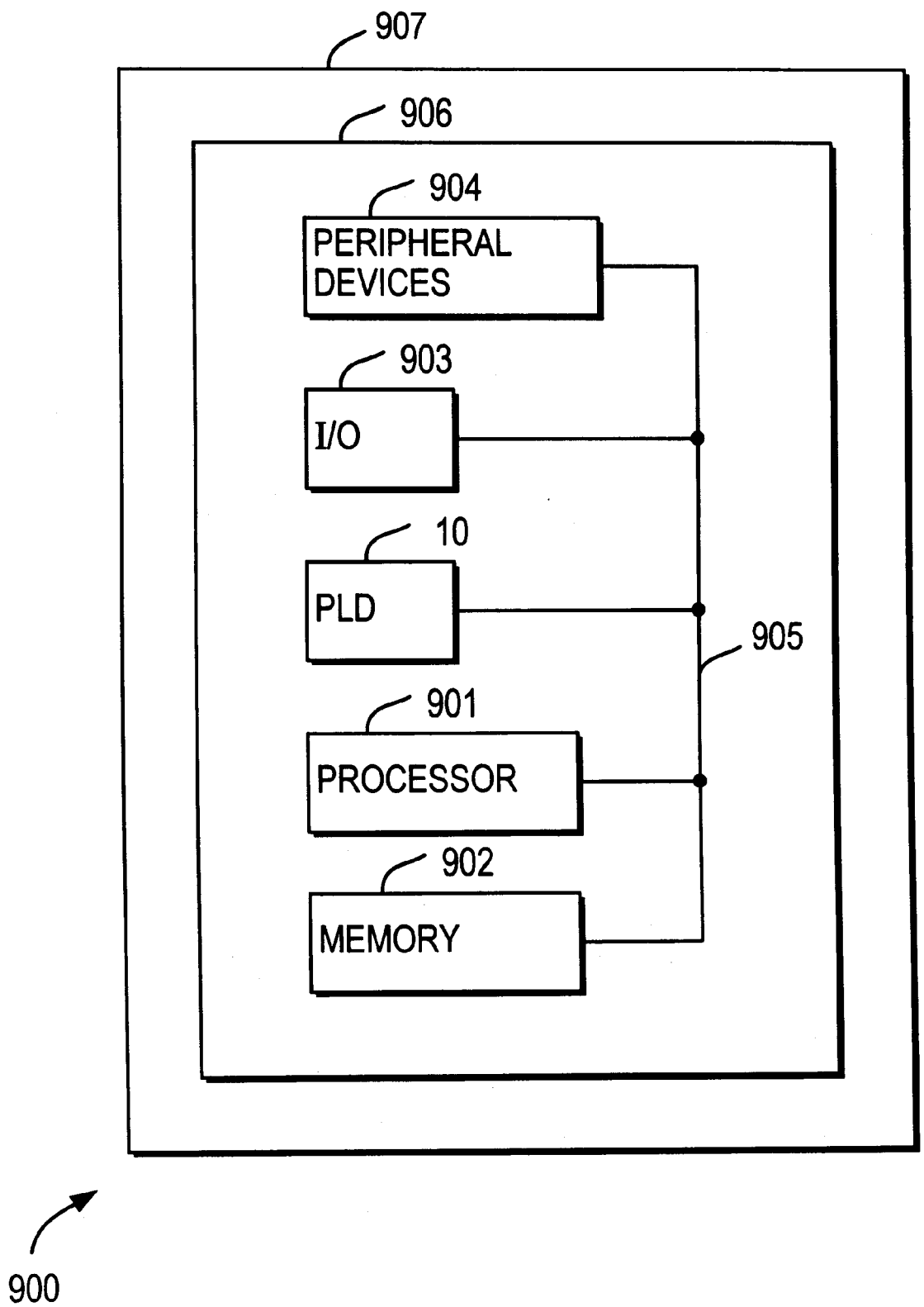
FIG. 15 is a simplified block diagram of an illustrative system employing a programmable logic device in accordance with the invention.

FIG. 15 illustrates a programmable logic device 10 of this invention in a data processing system 900. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 901. Programmable logic device 10 may also be used as an arbiter for arbitrating access to a shared resource in system 900. In yet another example, programmable logic device 10 can be configured as an interface between processor 901 and one of the other components in system 900. It should be noted that system 900 is only exemplary, and that the true scope and spirit of the invention should be indicated by the following claims.

Various technologies can be used to implement programmable logic devices 10 having the features of this invention, as well as the various components of those devices (e.g., the above-described PLCs and the FCEs that control the PLCs). For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product-term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the various components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the foregoing is only illustrative of the principles of the invention, and that various modifications can be made by those skilled in the art without departing from the scope and spirit of the invention. For example, the numbers of the various types of resources on device 10 can be different from the numbers present in the depicted and described illustrative embodiment. This applies to such parameters as the numbers of rows and columns of the various types of circuitry, the number of regions 30 in each block 20, the numbers of the various types of interconnection conductors, the numbers and sizes of the PLCs provided for making interconnections between various types of interconnection conductors, etc. It will also be understood that various directional and orientational terms such as "vertical" and "horizontal," "left" and "right," "above" and "below," "row" and "column," and the like are used herein only for convenience, and that no fixed or absolute directional or orientational limitations are intended by the use of these words. For example, the devices of this invention can have any desired orientation. If reoriented, different directional or orientational terms may need to be used in their description, but that will not alter their fundamental nature as within the scope and spirit of this invention. Terms like "block" and "region" are also used only as generic, relative terms, and other terms may be used for generally similar circuitry. Alternatively, devices within the scope of this invention may have blocks of programmable logic that are not divided into regions. Although look-up table logic is employed in the illustrative embodiment shown and described herein, it will be understood that other types of logic may be used instead if desired. For example, sum-of-products logic, such as is the primary example considered in, e.g., U.S. Pat. Nos. 5,241,224 and 5,371,422 (both of which are hereby incorporated by reference-herein in their entireties), may be used instead of look-up table logic.

Thus it is seen that a programmable logic device in which the values of carry signals can be predicted or determined in advance of completion of the operation forming the carry signal, has been provided. One skilled in the art will appreciate that the present invention can be practiced by other than the described embodiments, which are presented for purposes of illustration and not of limitation, and the present invention is limited only by the claims which follow.

What is claimed is:

1. A programmable logic device comprising:
    a plurality of regions of programmable logic, each having a plurality of input terminals and at least one output terminal, and each being programmable to selectively perform any of a plurality of logic functions on input signals applied to the input terminals to produce an output signal applied to the output terminal; and
    an interconnection network which is programmable to selectively connect the output terminal of substantially any of the regions to at least one of the input terminals of substantially any of the regions; wherein:
        said programmable logic device is programmable to configure a plurality of said regions to perform a logic function requiring provision of at least one carry signal from one of said regions to another of said regions; and
    said regions are arranged in groups; said device further comprising:
        additional logic dedicated to propagating said carry signal to other said regions without regard to completion of logic operations in said region, said additional logic including circuitry for propagating said carry signal from one said group of regions to another said group of regions, said circuitry including a carry-out in one said group for outputting a carry signal from said one said group and a carry-in in another said group for inputting a carry signal to said another said group, said carry-in and said carry-out being arranged adjacent one another.

2. The programmable logic device of claim 1 wherein: said regions are arranged in each said group in a column and said groups are arranged in rows and columns; and said carry-in and said carry-out are horizontally adjacent.

3. The programmable logic device of claim 1 wherein said additional logic comprises:
    circuitry in individuals regions in said group for at least one of (a) assuming both possible values for a carry-in signal from another of said regions, and (b) producing both possible values of a carry-out signal for said region, and
    circuitry in said group for receiving an input of a carry-in signal from outside said group and for using said carry-in signal from outside said group to select one of said possible values of a carry-out signal.

4. The programmable logic device of claim 3 wherein said circuitry in said group comprises:
    a respective multiplexer in at least one said region having:
        as data inputs, said both possible values of a carry-out signal for said region,
        as a control input, said carry-in signal from outside said group, and
        as an output, a carry-out signal for use in performance of one or more logic functions in said region; and
    at least one group carry multiplexer having:
        as data inputs, said both possible values of a carry-out signal for one of said regions,
        as a control input, said carry-in signal from outside said group, and
        as an output, a carry-out signal for said group.

5. The programmable logic device of claim 4 wherein:
    said regions in said group are divided into first and second subgroups, each of said subgroups comprising a respective plurality of said regions;
    said at least one group carry multiplexer comprises a first group carry multiplexer for said first subgroup and a second group carry multiplexer for said second subgroup;
    said first group carry multiplexer has:
        as data inputs, said both possible values of a carry-out signal for one of said regions in said first subgroup,
        as a control input, said carry-in signal from outside said group, and
        as an output, a carry-out signal for said first subgroup; and
    said second group carry multiplexer has:
        as data inputs, said both possible values of a carry-out signal for one of said regions in said second subgroup,
        as a control input, said carry-out signal for said first subgroup, and
        as an output, said carry-out signal for said group.

6. The programmable logic device of claim 5 wherein:
    said regions are arranged in each said group in a column and said groups are arranged in rows and columns;
    in each said group, said regions of each said subgroup are chained with a least significant region at an end of said column and most significant region furthest from said end, respective most significant regions of said respective subgroups being adjacent one another;
    said group carry multiplexers are located adjacent said most significant regions;
    said carry-in signal from outside said group enters said first group carry multiplexer from a direction along said row; and
    said carry-out signal for said group exits said second group carry multiplexer in said direction along said row.

7. The programmable logic device of claim 1 wherein said additional logic comprises:

circuitry in said one said group for calculating, separately from said logic function, said value for said carry signal to be input to said another said group as a function of a signal propagated into said one said group.

8. The programmable logic device of claim 7 wherein:

each region in said plurality of regions receives a carry signal from another region in said plurality of regions;

each said region in said plurality of regions includes said circuitry for evaluating a function of a signal propagated to said region;

said signal propagated to each said region is a result of evaluating in a different region said function of a signal propagated to said different region.

9. A digital processing system comprising:

processing circuitry;

a memory coupled to said processing circuitry; and a programmable logic device as defined in claim 1 coupled to the processing circuitry and the memory.

10. A printed circuit board on which is mounted a programmable logic device as defined in claim 1.

11. The printed circuit board defined in claim 10 further comprising:

memory circuitry mounted on the printed circuit board and coupled to the programmable logic device.

12. The printed circuit board defined in claim 11 further comprising:

processing circuitry mounted on the printed circuit board and coupled to the memory circuitry.

13. A programmable logic device comprising:

a plurality of regions of programmable logic, each having a plurality of input terminals and at least one output terminal, and each being programmable to selectively perform any of a plurality of logic functions on input signals applied to the input terminals to produce an output signal applied to the output terminal; and an interconnection network which is programmable to selectively connect the output terminal of substantially any of the regions to at least one of the input terminals of substantially any of the regions; wherein:

said programmable logic device is programmable to configure a plurality of said regions into a chain of at least three regions to perform a logic function requiring provision of a carry signal from each of said regions to a subsequent region in said chain; and said device further comprises additional logic including circuitry in each of said regions for:

receiving a carry signal from a region immediately preceding an immediately preceding region in said chain, receiving at least one propagation signal from said immediately preceding region in said chain, receiving at least one propagation signal from within said region, and producing a carry signal as a function of (1) said carry signal from said region immediately preceding said immediately preceding region in said chain, (2) said at least one propagation signal from said immediately preceding region, and (3) said at least one propagation signal from within said region.

14. The programmable logic device of claim 13 wherein, for each said region, said at least one propagation signal is a function of data inputs to said region.

15. The programmable logic device of claim 14 wherein said at least one propagation signal comprises two propagation signals.

16. A digital processing system comprising:

processing circuitry;

a memory coupled to said processing circuitry; and a programmable logic device as defined in claim 13 coupled to the processing circuitry and the memory.

17. A printed circuit board on which is mounted a programmable logic device as defined in claim 13.

18. The printed circuit board defined in claim 17 further comprising:

memory circuitry mounted on the printed circuit board and coupled to the programmable logic device.

19. The printed circuit board defined in claim 18 further comprising:

processing circuitry mounted on the printed circuit board and coupled to the memory circuitry.

* * * * *